(12) United States Patent
Gosain et al.

(10) Patent No.: US 7,144,793 B2
(45) Date of Patent: Dec. 5, 2006

(54) METHOD OF PRODUCING CRYSTALLINE SEMICONDUCTOR MATERIAL AND METHOD OF FABRICATING SEMICONDUCTOR DEVICE

(75) Inventors: Dharam Pal Gosain, Tokyo (JP); Akio Machida, Kanagawa (JP); Kazushi Nakano, Tokyo (JP); Toshio Fujino, Kanagawa (JP); Junichi Sato, Tokyo (JP)

(73) Assignee: Sony Corporation, Tokyo (JP)

( * ) Notice: Subject to any disclaimer, the term of this patent is extended or adjusted under 35 U.S.C. 154(b) by 29 days.

(21) Appl. No.: 10/645,805

(22) Filed: Aug. 21, 2003

(65) Prior Publication Data

US 2004/0209447 A1 Oct. 21, 2004

(30) Foreign Application Priority Data

Aug. 22, 2002 (JP) .......................... P2002-242614

(51) Int. Cl.
 *H01L 21/20* (2006.01)
(52) U.S. Cl. .................. 438/486; 438/487; 438/488
(58) Field of Classification Search ................ 438/486, 438/487, 488, 485, 484
See application file for complete search history.

(56) References Cited

U.S. PATENT DOCUMENTS

| | | | |
|---|---|---|---|
| 6,287,944 B1* | 9/2001 | Hara et al. | 438/488 |
| 6,566,754 B1* | 5/2003 | Hara et al. | 257/755 |
| 6,573,161 B1* | 6/2003 | Miyasaka et al. | 438/487 |
| 6,756,614 B1* | 6/2004 | Hatano et al. | 257/192 |
| 6,872,977 B1* | 3/2005 | Hatano et al. | 257/64 |
| 2003/0104662 A1* | 6/2003 | Hatano et al. | 438/166 |
| 2004/0209447 A1* | 10/2004 | Gosain et al. | 438/486 |
| 2005/0172888 A1* | 8/2005 | Gosain et al. | 117/87 |

OTHER PUBLICATIONS

Australian Search Report, unavailable.
Derwent Abstract Accession No. 89-351354/48, Class U11, JP 01-261291 A (Agency of Ind Sci Tech) Oct. 18, 1989 Abstract (Relevant to Claim No. 1-37).
Smith et al, 'Silicon-on-insulator by graphoepitaxy and zone-melting recrystallization of patterned films', Journal of Crystal Growth, North-Holland, 1983, vol. 73, pp. 527-546 Section 3 (Relevant to Claim No. 1-37).
Ishihara, R.K., 'Location control of laterally columnar Si grains by dual-beam excimer-laser melting of Si thin-film', Materials Research Society Symposium Proceedings, 2000, vol. 621, pp. Q9.4.1-Q9.4.6. Whole document (Relevant to Claim No. 1-37).

* cited by examiner

Primary Examiner—Laura M. Schillinger
(74) Attorney, Agent, or Firm—Sonnenschein Nath & Rosenthal LLP

(57) ABSTRACT

Disclosed are a method of producing a crystalline semiconductor material capable of improving the crystallinity and a method of fabricating a semiconductor device using the crystalline semiconductor material. An amorphous film is uniformly irradiated with a pulse laser beam (energy beam) emitted from an XeCl excimer laser by 150 times so as to heat the amorphous film at such a temperature as to partially melt crystal grains having the {100} orientations with respect to the vertical direction of a substrate and melt amorphous film or crystal grains having face orientations other than the {100} orientations. Silicon crystals having the {100} orientations newly occur between a silicon oxide film and liquid-phase silicon and are bonded to each other at random, to newly form crystal grains having the {100} orientations. Such a crystal grain creation step is repeated, to form a crystalline film which has crystal grains preferentially grown in the {100} orientations with respect to the vertical direction of the substrate and thereby has sharp square-shaped crystal grain boundaries.

20 Claims, 17 Drawing Sheets

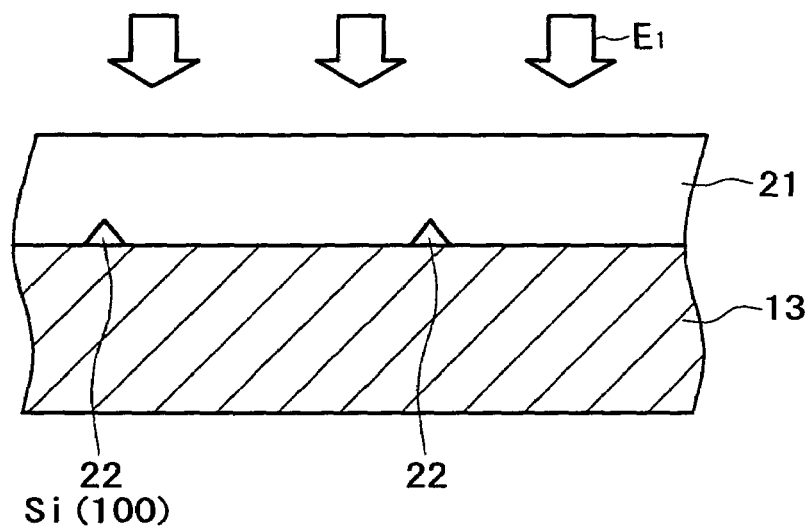
F I G. 3 A
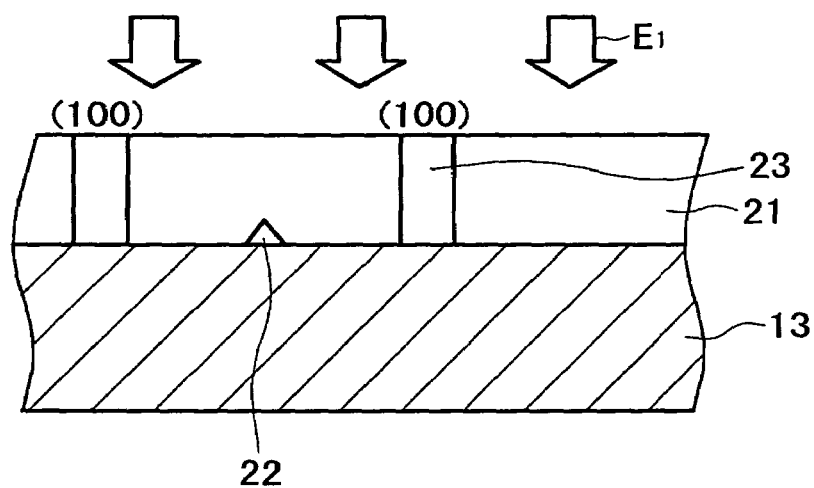
F I G. 3 B
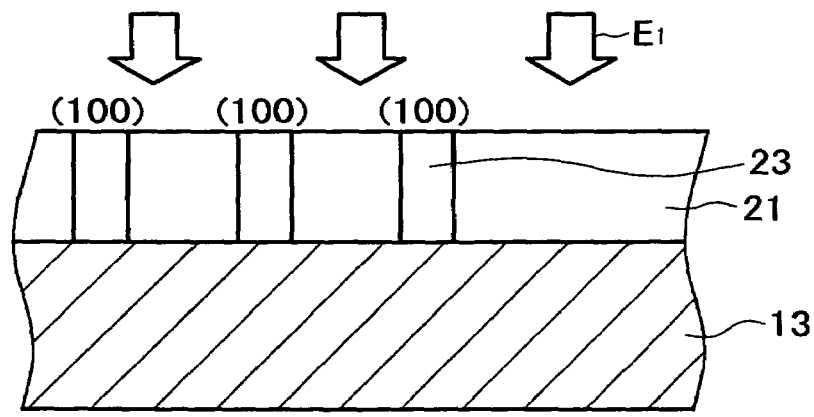
F I G. 3 C

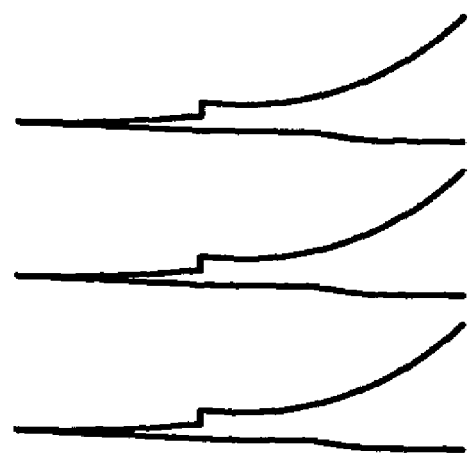
F I G. 6 B
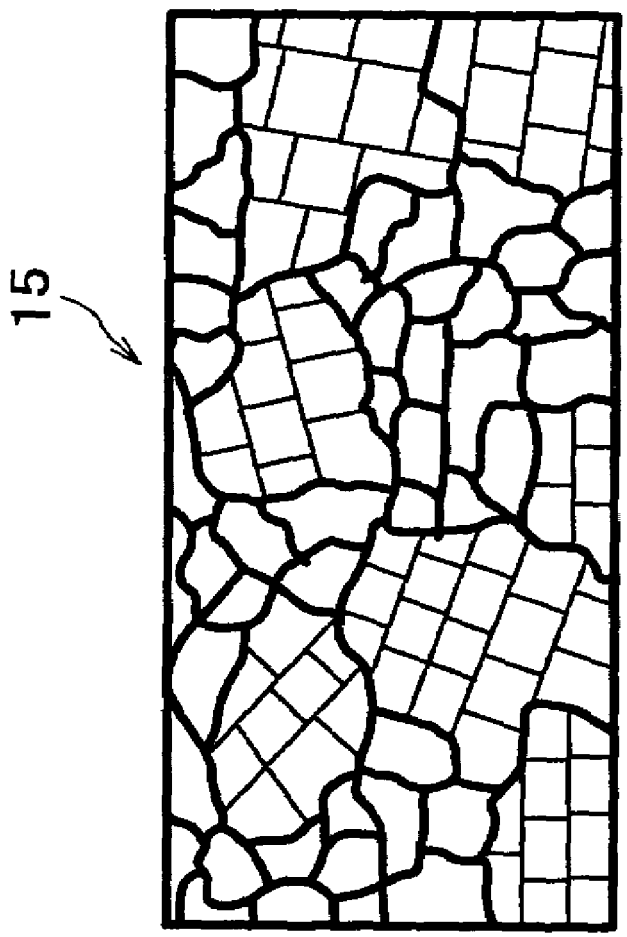
F I G. 6 A

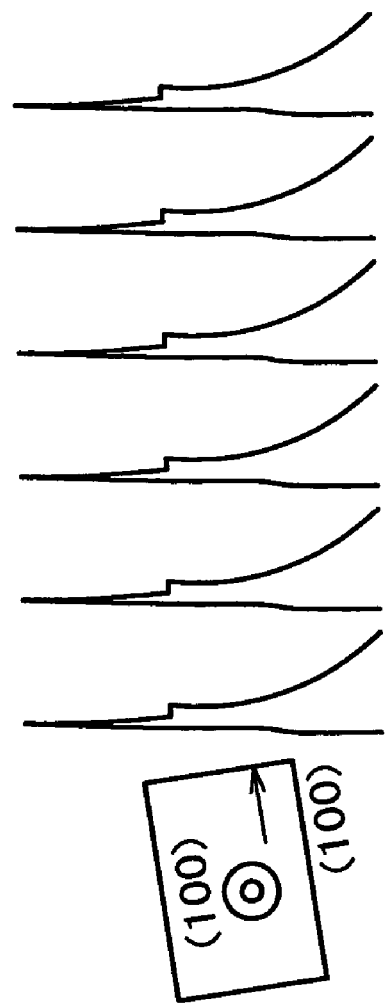
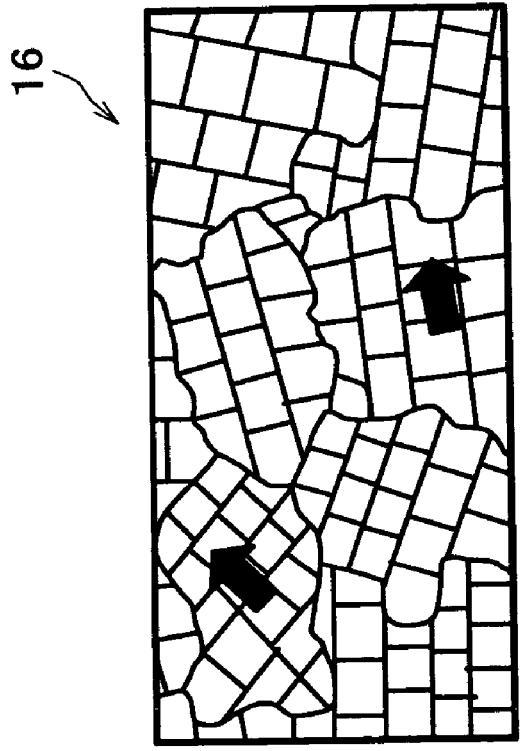
F I G. 7 A
F I G. 7 B

FIG. 11A
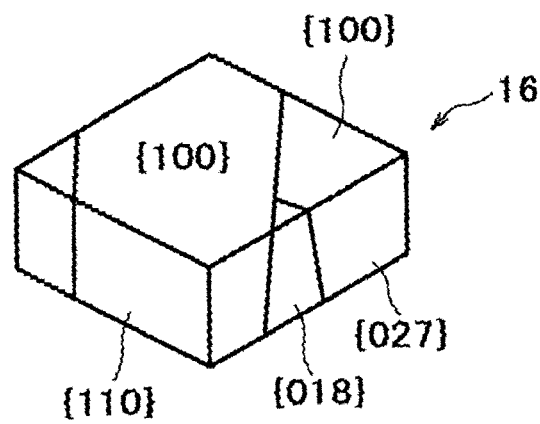
FIG. 11B
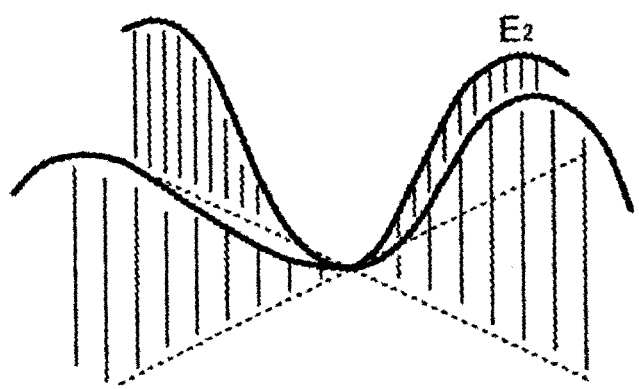
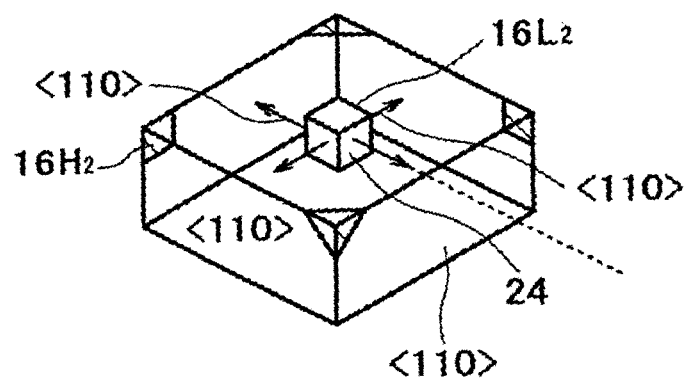
FIG. 11C
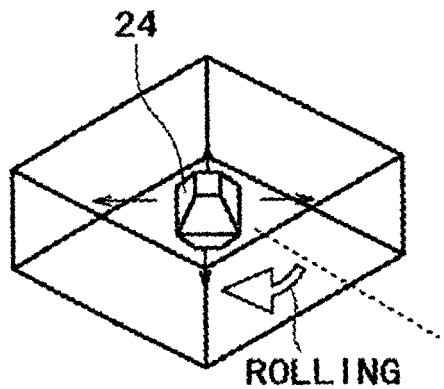

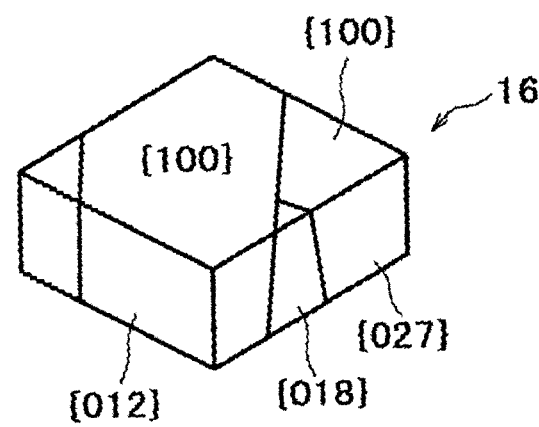
FIG. 12A
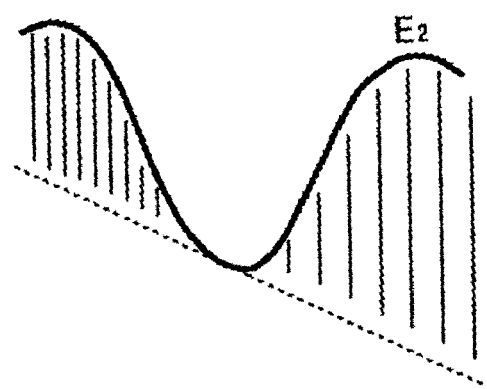
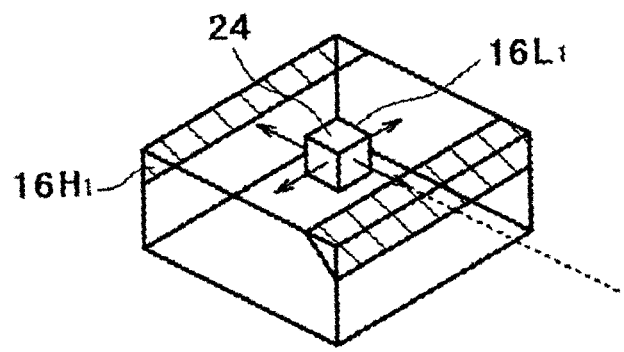
FIG. 12B
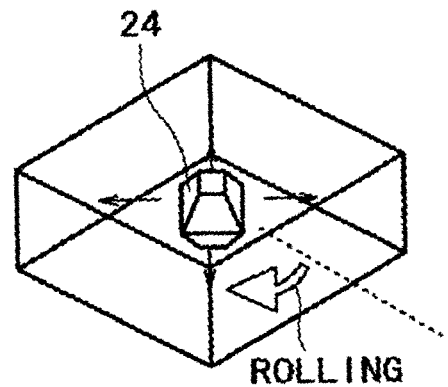
FIG. 12C

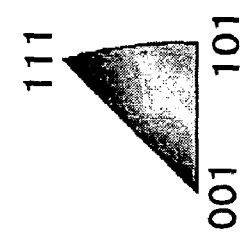
FIG. 13C
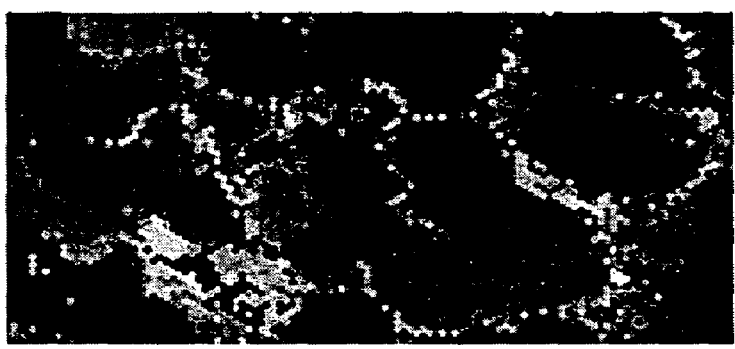
FIG. 13B
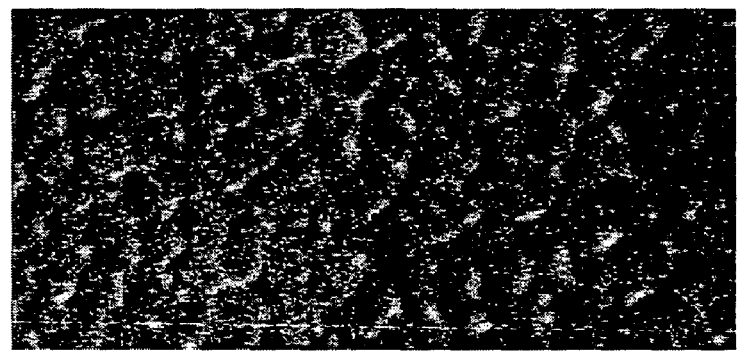
FIG. 13A

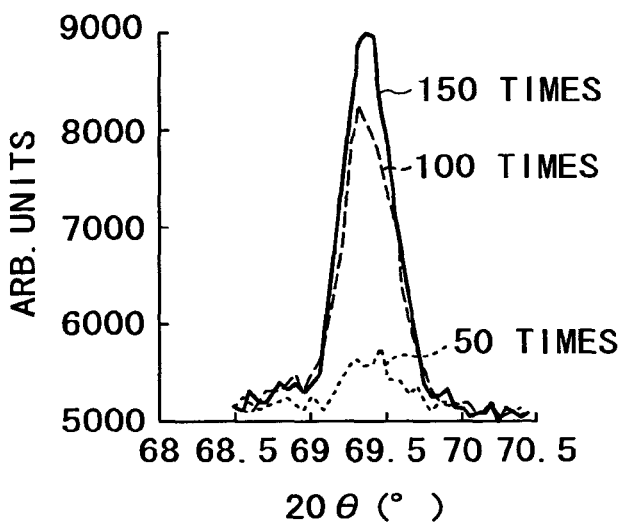
F I G. 17A
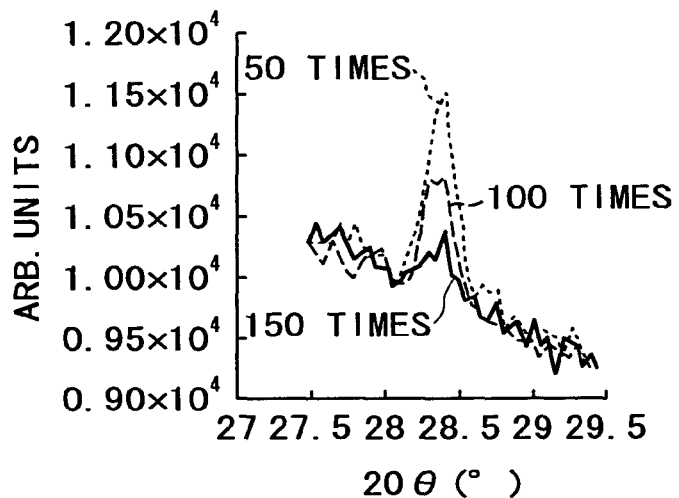
F I G. 17B
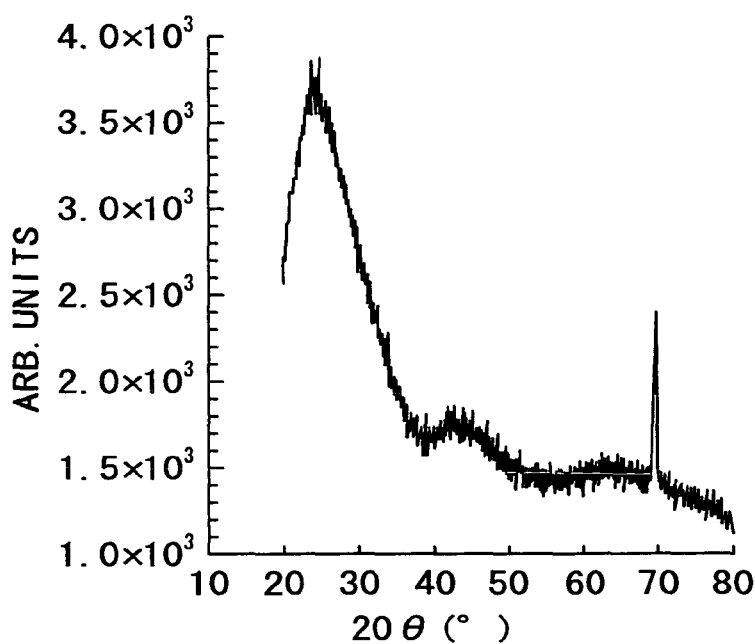
F I G. 17C

FIG. 18
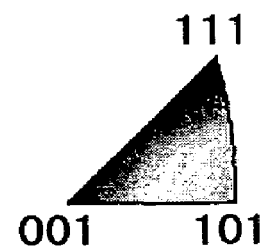
4.50 μm=45 steps IPF[100]
FIG. 19
······ MAGNIFIED VIEW

METHOD OF PRODUCING CRYSTALLINE SEMICONDUCTOR MATERIAL AND METHOD OF FABRICATING SEMICONDUCTOR DEVICE

RELATED APPLICATION DATA

The present application claims priority to Japanese Application(s) No(s). P2002-242614 filed Aug. 22, 2002, which application(s) is/are incorporated herein by reference to the extent permitted by law.

BACKGROUND OF THE INVENTION

The present invention relates to a method of producing a crystalline semiconductor material by heating an amorphous semiconductor material or a polycrystalline semiconductor material so as to crystallize the material, and a method of fabricating a semiconductor device using such a crystalline semiconductor material.

In recent years, semiconductor devices used, for example, for a solar cell including such semiconductor devices formed on a substrate in an array pattern and for a liquid crystal display unit including such semiconductor devices as pixel drive transistors have been actively studied and developed. Further, in recent years, to realize a high degree of integration and multi-function of semiconductor devices, a three-dimensional integrated circuit including the semiconductor devices stacked on a substrate has been actively studied and developed.

A glass material such as artificial quartz or a plastic material has drawn attention as a substrate material used for these semiconductor devices because the glass material or plastic material is inexpensive and is easily formable into a large-size substrate. In general, when a semiconductor thin film is deposited on a substrate made from such an amorphous insulating material, since the amorphous insulating material has no long-range order, the deposited semiconductor thin film has an amorphous or polycrystalline structure.

For example, with respect to a thin film transistor (TFT) used as a pixel drive transistor in a liquid crystal display unit, an operational region (channel region) is formed by a polycrystalline silicon (Si) film formed on the above-described substrate. The use of the polycrystalline silicon film for forming the operational region, however, has a disadvantage that the crystallinity of the polycrystalline silicon film is poor because crystal grains boundaries are present at random in the fine structure of the film and crystal grains have different face orientations. Another disadvantage is that as the grain sizes of crystal grains in the polycrystalline silicon film become as large as being close to the channel length of the TFT, the characteristics of the TFT may become uneven. In this way, a semiconductor device such as a TFT using a polycrystalline silicon film is very inferior in characteristics to a semiconductor device using a single crystal silicon film.

From this viewpoint, a single crystallization technique of a silicon film formed on a substrate made from a glass material has bee proposed. For example, an attempt has been made to form a single crystal silicon film on a substrate made from silicon oxide by using a ZMR (Zone Melting Re-crystallization) technique (see H. A. Atwater et al.: Appl. Phys. Lett. 41 (1982) 747, or K. Egami et al.: Appl. Phys. Lett. 44 (1984) 962). Another attempt has been made to form a silicon film having a very large area on a substrate made from quartz or glass (see A. Hara et al.: AMLCD Technical Digest p. 227, Tokyo 2002).

The ZMR technique allows formation of a silicon film having a large area, but has a difficulty in control of orientation of crystal grains and crystal grain boundaries. Accordingly, a silicon film formed by the ZMR technique contains crystal grain boundaries that are present at random, and is therefore difficult to be applied to three-dimensional integration of semiconductor devices, which integration requires a high-level equalization of the semiconductor devices. Another problem of the ZMR technique is that since the ZMR technique is a high temperature process requiring a large thermal load such as about 1450° C., such a ZMR technique cannot be applied to a plastic material expected as a substrate material. Taking into account the heat resistance of a plastic material, a low temperature process performed at about 200° C. or less is desirable.

In recent year, a method of producing a silicon film having crystal grains grown in the $\{111\}$ orientations on a buffer layer made from silicon nitride by laser irradiation using a second harmonic neodymium laser ($Nd:YVO_4$ laser) having a wavelength of 532 nm has been disposed (see M. Nerding et al.: Thin Solid Films 383 (2001) 110). This method, however, has an inconvenience that since a silicon film having crystal grains grown in the $\{100\}$ orientations has been used for a semiconductor device in an advanced MOS transistor, the silicon film having the crystal grains grown in the $\{111\}$ orientations cannot be applied to a process of fabricating the above-described MOS transistor. In addition, the reason why the silicon film having crystal grains grown in the $\{100\}$ orientations is used for the above-described semiconductor device is that the silicon crystal grains having the $\{100\}$ orientations are lower in interface level density than silicon crystal grains having face orientation other than the $\{100\}$ orientations, and therefore, suitable for forming a transistor sensitive to interface characteristics.

As described above, according to the related art techniques, it has been difficult to control crystal grain boundaries of a crystalline film formed on a substrate made from a glass material or plastic material, to control the face orientations of crystal grains to specific face orientations (for example, $\{100\}$ orientations for a silicon film) with respect to the vertical direction of the substrate, and to control face orientations of the crystal grains in the in-plane direction of the substrate, thereby failing to equalize the quality of a semiconductor device and sufficiently enhance the performance thereof.

SUMMARY OF THE INVENTION

An object of the present invention is to provide a method of producing a crystalline semiconductor material, which is capable of forming a semiconductor material having good crystallinity at a low temperature on a substrate made from a glass material or plastic material, and to provide a method of fabricating a semiconductor device using such a crystalline semiconductor material.

To achieve the above object, according to a first aspect of the present invention, there is provided a method of producing a crystalline semiconductor material composed of a plurality of single-crystal grains of a semiconductor, including a first step of forming an amorphous material of the semiconductor or a polycrystalline material of the semiconductor on a substrate, and a second step of forming a crystalline material by uniformly heat-treating the amorphous material or the polycrystalline material by a plurality of times at such a temperature as to partially melt crystal grains having a specific face orientation with respect to the vertical direction of the surface of the substrate and melt the amorphous material or crystal grains having a face orientation other than the specific face orientation.

According to a second aspect of the present invention, there is provided a method of producing a crystalline semiconductor material composed of a plurality of single-crystal grains of a semiconductor, including a first step of forming an amorphous material of the semiconductor or a polycrystalline material of the semiconductor on a substrate, a second step of forming a first crystalline material by uniformly heat-treating the amorphous material or the polycrystalline material by a plurality of times at such a temperature as to partially melt crystal grains having a specific face orientation with respect to the vertical direction of the surface of the substrate and to melt the amorphous material or crystal grains having a face orientation other than the specific face orientation, and a third step of forming a second crystalline material by heat-treating the first crystalline material by a plurality of times so as to selectively form, on the first crystalline material, a temperature distribution having a high temperature region and a low temperature region whose temperature is lower than that of the high temperature region, wherein the temperature of the low temperature region is set to partially melt the crystal grains having the specific face orientation.

According to a third aspect of the present invention, there is provided a method of fabricating a semiconductor device using a crystalline semiconductor material composed of a plurality of single-crystal grains of a semiconductor, including a first step of forming an amorphous material of the semiconductor or a polycrystalline material of the semiconductor on a substrate, and a second step of forming a crystalline material by uniformly heat-treating the amorphous material or the polycrystalline material by a plurality of times at such a temperature as to partially melt crystal grains having a specific face orientation with respect to the vertical direction of the surface of the substrate and melt the amorphous material or crystal grains having a face orientation other than the specific face orientation.

According to a fourth aspect of the present invention, there is provided a method of fabricating semiconductor device using a crystalline semiconductor material composed of a plurality of single-crystal grains of a semiconductor, including a first step of forming an amorphous material of the semiconductor or a polycrystalline material of the semiconductor on a substrate, a second step of forming a first crystalline material by uniformly heat-treating the amorphous material or the polycrystalline material by a plurality of times at such a temperature as to partially melt crystal grains having a specific face orientation with respect to the vertical direction of the surface of the substrate and to melt the amorphous material or crystal grains having a face orientation other than the specific face orientation, and a third step of forming a second crystalline material by heat-treating the first crystalline material by a plurality of times so as to selectively form, on the first crystalline material, a temperature distribution having a high temperature region and a low temperature region whose temperature is lower than that of the high temperature region, wherein the temperature of the low temperature region is set to partially melt the crystal grains having the specific face orientation.

In accordance with the method of producing a crystalline semiconductor material according to the first aspect and the method of fabricating a semiconductor device according to the third aspect, since the amorphous material or the polycrystalline material are uniformly heat-treated by a plurality of times at such a temperature as to partially melt crystal grains having a specific face orientation with respect to the vertical direction of the surface of the substrate and melt the amorphous material or crystal grains having a face orientation other than the specific face orientation, it is possible to form a crystalline material which has crystal grains preferentially grown in the specific face orientation with respect to the vertical direction of the substrate and thereby has sharp crystal grain boundaries, and hence to improve the crystallinity of the crystalline material.

In accordance with the method of producing a crystalline semiconductor material according to the second aspect and the method of fabricating a semiconductor device according to the fourth aspect, in the second step, a first crystalline material is formed by uniformly heat-treating the amorphous material or the polycrystalline material by a plurality of times at such a temperature as to partially melt crystal grains having a specific face orientation with respect to the vertical direction of the surface of the substrate and to melt the amorphous material or crystal grains having a face orientation other than the specific face orientation; and in the third step, a second crystalline material is formed by heat-treating the first crystalline material by a plurality of times so as to selectively form, on the first crystalline material, a temperature distribution having a high temperature region and a low temperature region whose temperature is lower than that of the high temperature region, wherein the temperature of the low temperature region is set to partially melt the crystal grains having the specific face orientation. As a result, it is possible to form the second crystalline material having crystal grains preferentially grown in the specific face orientation with respect to the vertical direction of the substrate and preferentially grown in a controlled face orientation in the in-plane direction of the substrate, and hence to control the crystal grain boundaries in the second crystalline material and improve the crystallinity of the second crystalline material.

BRIEF DESCRIPTION OF THE DRAWINGS

These and other objects, features, and advantages of the present invention will become more apparent from the following detailed description in conjunction with the accompanying drawings, wherein:

FIGS. 3A to 3C are sectional views illustrating a first heat-treatment;

FIG. 6A is a plan view illustrating the heating step shown in FIGS. 3A to 3C, and FIG. 6B is a diagram showing a schematic shape of the pulse laser beam used for the heating step shown in FIGS. 3A to 3C;

FIG. 7A is a plan view illustrating the heating step shown in FIGS. 3A to 3C, and FIG. 7B is a diagram showing a schematic shape of a pulse laser beam used for the heating step shown in FIGS. 3A to 3C;

FIGS. 11A to 11E are typical views illustrating the second heat-treatment;

FIGS. 12A to 12E are typical views illustrating the second heat-treatment;

FIG. 13A is a SEM photograph of a sample having been subjected to the first heat-treatment, and FIGS. 13B and 13C are EBSP photographs of the sample having been subjected to the first heat-treatment;

FIGS. 17A to 17C show the results of X-ray analysis of the sample having been subjected to the first heat-treatment;

FIG. 18 is a EBSP photograph of a sample having been subjected to the second heat-treatment; and FIG. 19 is a SEM photograph of the sample having been subjected to the second heat-treatment;

DETAILED DESCRIPTION OF THE PREFERRED EMBODIMENTS

Hereinafter, preferred embodiments of the present invention will be described with reference to the drawings.

Figure 1:
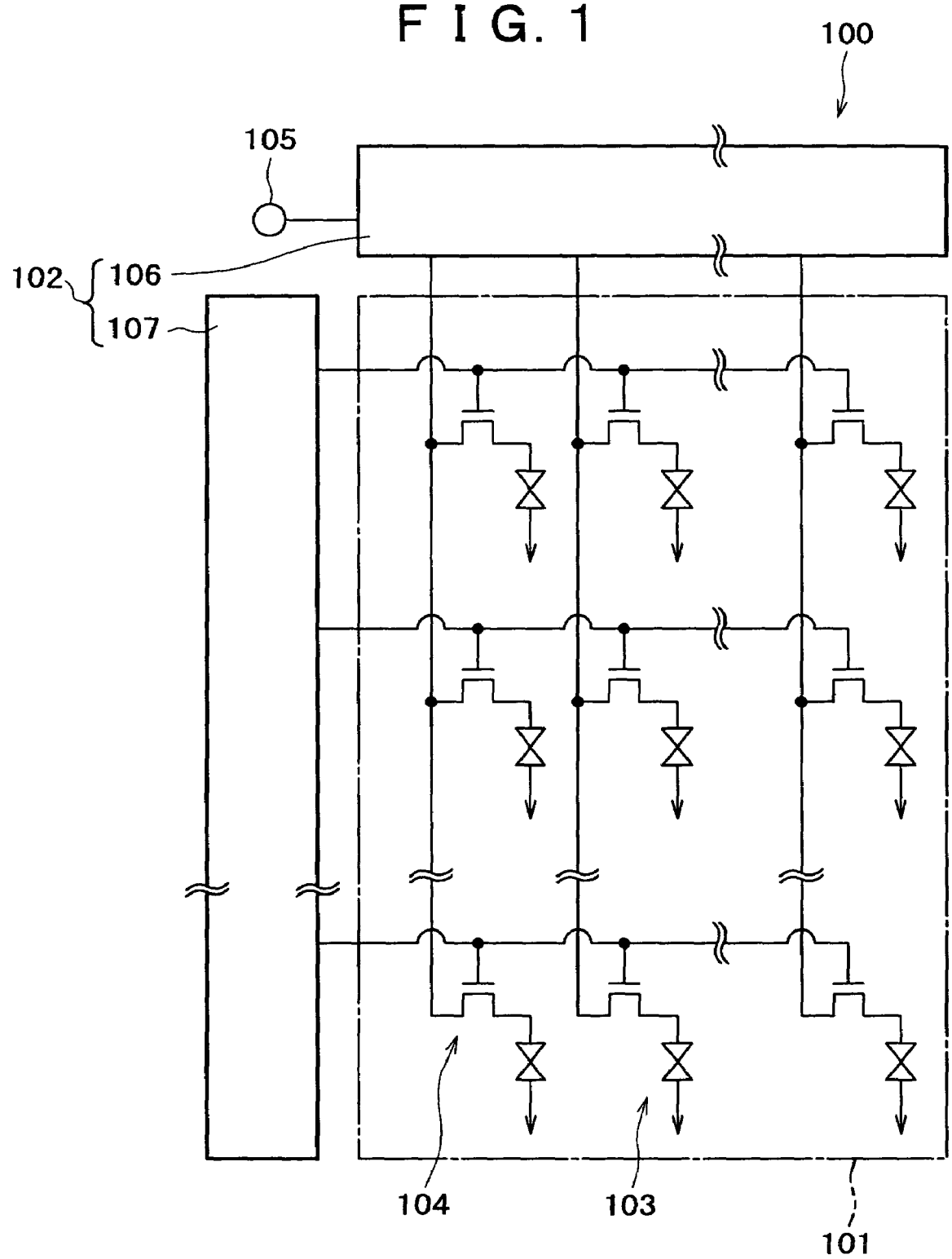
FIG. 1 is a typical block diagram showing the structure of a liquid crystal display unit fabricated by a method according to one embodiment of the present invention.

In the following embodiments, description will be made by example of a method of fabricating a semiconductor device unit represented by a liquid crystal display unit 100 shown in FIG. 1.

The liquid crystal display unit 100 includes, on a substrate (not shown), a pixel portion 101 and a peripheral circuit portion 102 disposed on the periphery of the pixel portion 101. A liquid crystal layer 103 and a plurality of thin film transistors 104 arrayed in a matrix are formed on the pixel portion 101. The thin film transistors 104 are adapted to drive portions, corresponding to respective pixels, of the liquid crystal layer 103. The peripheral circuit portion 102 includes a horizontal scanning portion (horizontal scanning circuit or signal electrode drive circuit) 106 and a vertical scanning portion (vertical scanning circuit or scanning electrode drive circuit) 107. The horizontal scanning portion 106 has a video signal terminal 105 and is adapted to feed a horizontal scanning signal together with an inputted image signal. The vertical scanning portion 107 is adapted to feed a vertical scanning signal to the pixel portion 101.

In this liquid crystal display unit 100, an image signal is fed to the horizontal scanning portion 106 via the video signal terminal 105, and the image signal and a horizontal scanning signal are fed from the horizontal scanning portion 106 to the thin film transistor 104 corresponding to each of the pixels of the pixel portion 101; and a vertical scanning signal is fed from the vertical scanning portion 107 to the thin film transistor 104 corresponding to each of the pixels of the pixel portion 101, whereby the liquid crystal layer 103 is switchingly controlled, to perform image display.

Figure 2:
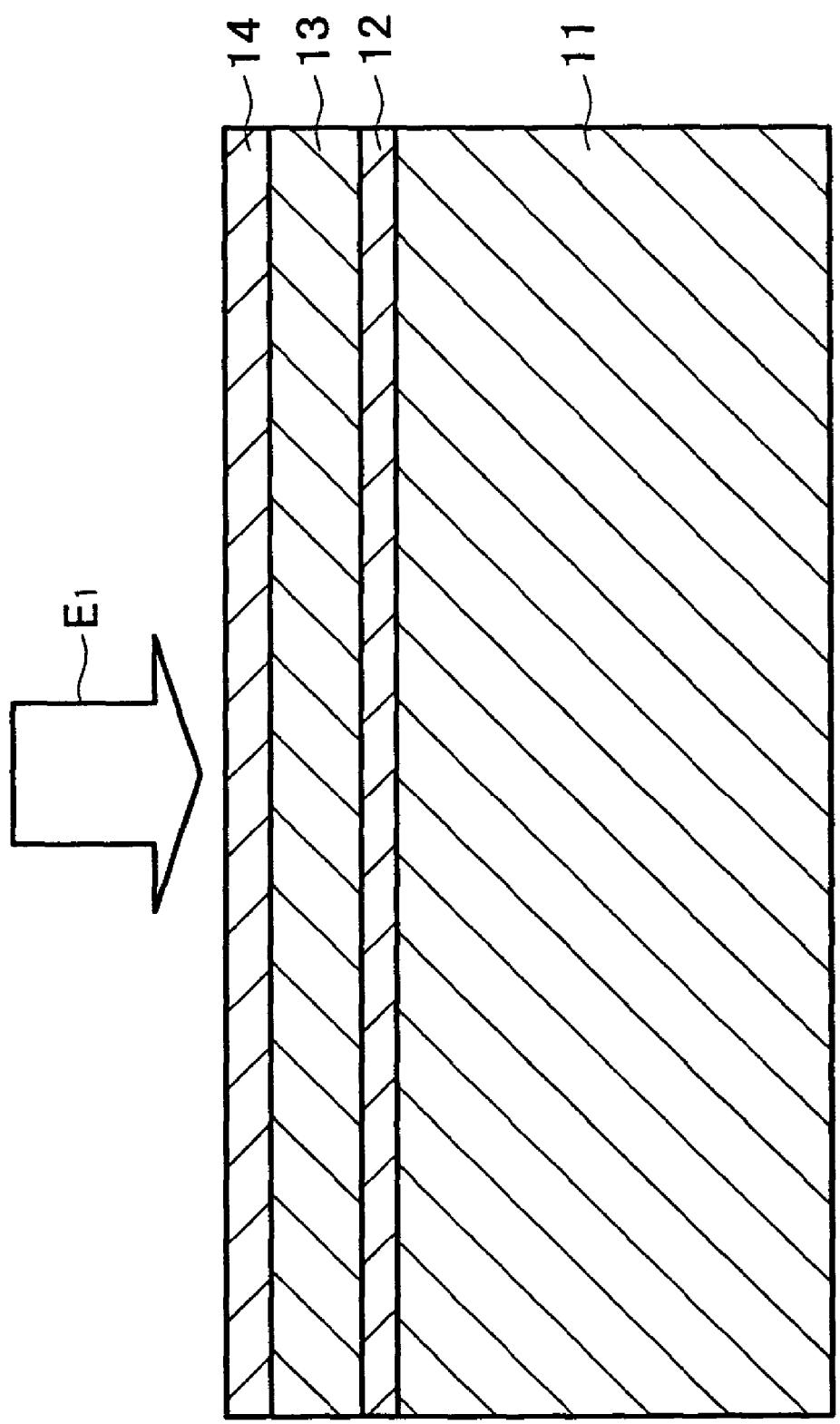
FIG. 2 is a view showing the structure of a sample used in the embodiment of the present invention.
Figure 4:
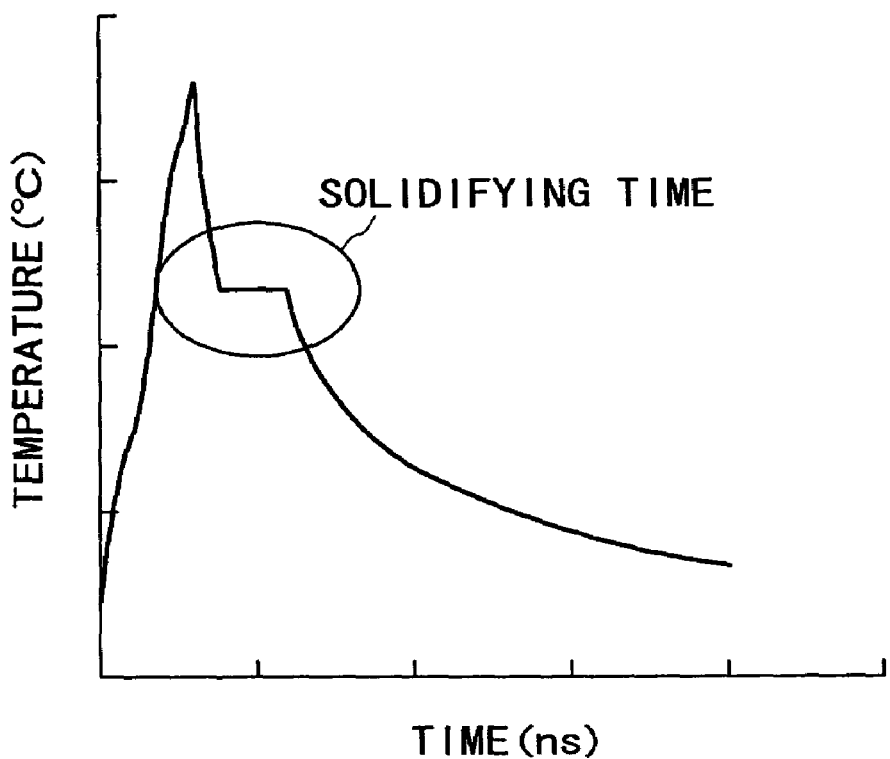
FIG. 4 is a diagram showing a schematic shape of one pulse of a pulse laser beam shown in FIG. 2.
Figure 8:
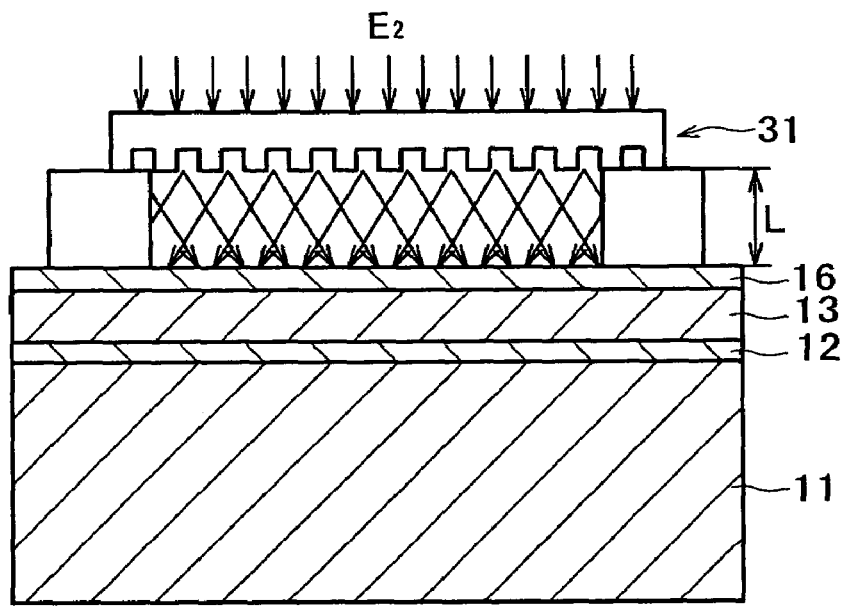
FIG. 8 is a sectional view illustrating a second heat-treatment.
Figure 9:
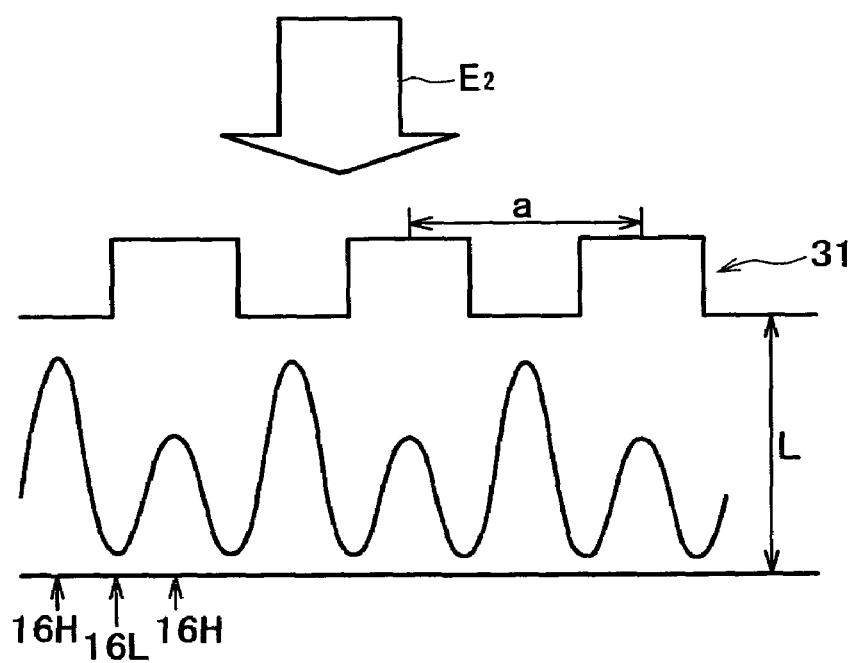
FIG. 9 is a sectional view of a diffraction grating used for the second heat-treatment shown in FIG. 8.
Figure 10:
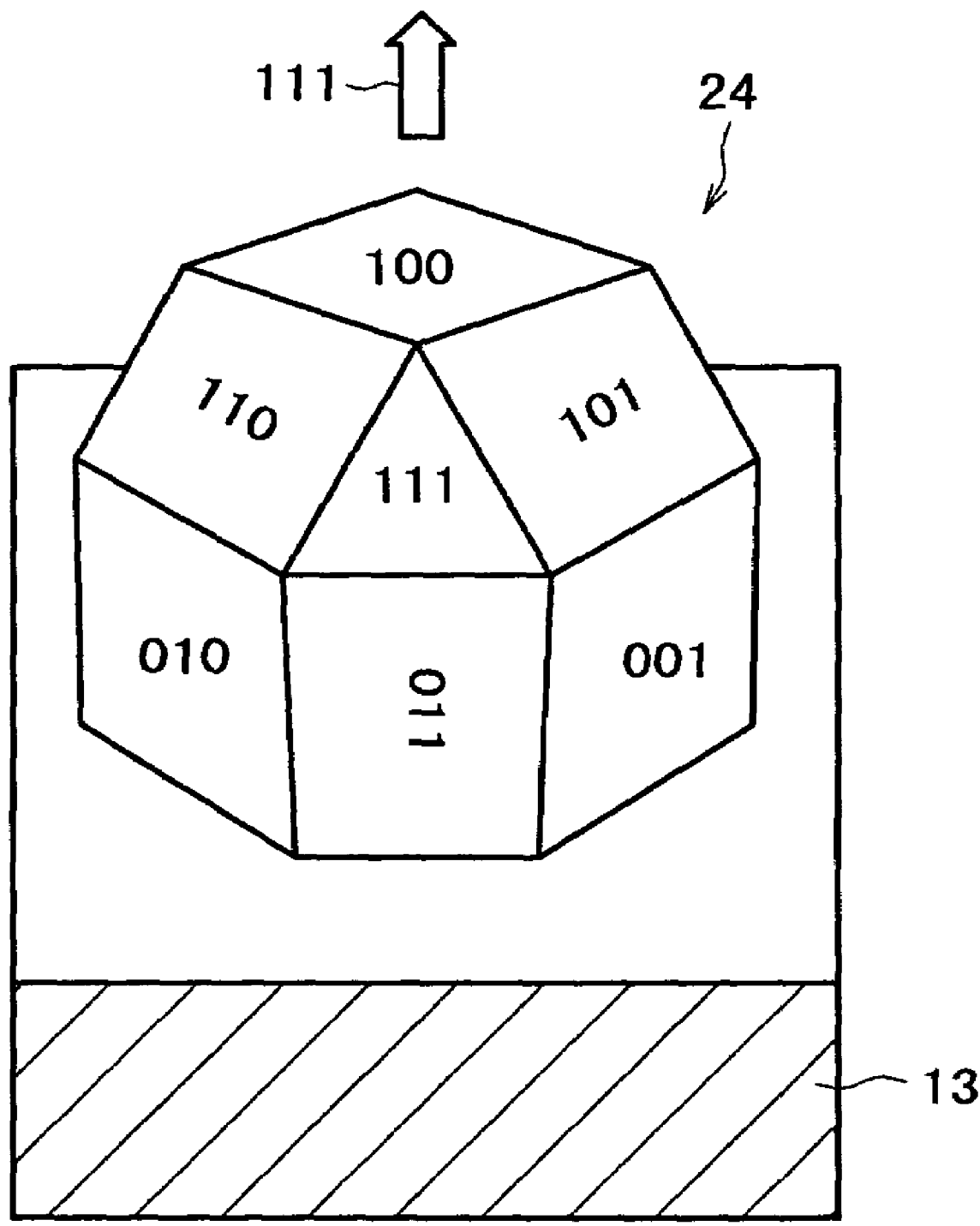
FIG. 10 is a typical view of a lamellae formed by the second heat-treatment.

FIGS. 2 to 12E are views illustrating a method of producing a crystalline semiconductor material according to one embodiment of the present invention, wherein FIG. 2 is a view showing a structure of a sample including an amorphous film 14; FIGS. 3A to 3C are views illustrating a first heat-treatment applied to the sample shown in FIG. 2; FIG. 4 is a diagram showing one pulse of an excimer laser beam used for the first heat-treatment and a second heat-treatment subsequent thereto; FIGS. 5A to 7B are diagrams illustrating a crystalline film 16 formed by subjecting the amorphous film 14 to the first heat-treatment; FIG. 8 is a view illustrating a second heat-treatment; FIG. 9 is a view illustrating a diffraction grating used for the second heat-treatment; and FIGS. 10 to 12E are typical views illustrating a method of forming a crystalline film 17A or 17B by subjecting the crystalline film 16 to the second heat-treatment. In addition, FIGS. 5A, 6A, and 7A each show the surface of the sample, and FIGS. 5B, 6B, and 7B each show a schematic waveform of a pulse laser beam used for irradiation of the surface of the sample.

In the following description, the term "a silicon crystal having {100} orientations" means a silicon crystal preferentially oriented in <100> directions. In the drawings, a silicon crystal (or silicon crystal grain) having the {100} orientations is often expressed by "Si(100) or (100)".

First, as shown in FIG. 2, an insulating substrate 11 made from a glass material is prepared. A silicon nitride film 12 made from silicon nitride ($SiN_x$: x is a positive number) is formed on the substrate 11 to a thickness of 50 nm, and a silicon oxide film 13 made from silicon oxide ($SiO_2$) is formed on the silicon nitride film 12 to a thickness of 120 nm. Each of the silicon nitride film 12 and the silicon oxide film 13 is formed by a CVD (Chemical Vapor Deposition) process or a sputtering process.

The material of the substrate 11 is not limited to the glass material but may be a plastic material. The silicon nitride film 12 and the silicon oxide film 13 function as protective films for preventing an amorphous film 14 (which is to be converted to a polycrystalline film 15, to a crystalline film 16, and further to a crystalline film 17A or 17B as will be described later) from being contaminated by impurities contained in the substrate 11 made from the glass material.

An amorphous film 14 made from amorphous silicon is formed on the silicon oxide film 13 by a CVD process, PECVD (Plasma Enhanced Chemical Vapor Deposition) process, or sputtering process. The thickness of the amorphous film 14 is preferably in a range of 10 nm to 200 nm for desirably forming a crystalline film 16, and a crystalline film 17A or 17B in the subsequent crystallization step. In this embodiment, for example, the amorphous film 14 having a thickness of 40 nm is formed.

In the case of forming the amorphous film 14 by the plasma CVD process, a large amount of hydrogen is contained in the amorphous film 14. To cope with such an inconvenience, it is preferred to remove hydrogen from the amorphous film 14 formed by plasma CVD by heating the amorphous film 14 for 2 hr at 450° C. or annealing the amorphous film 14 by a RTA (Rapid Thermal Annealing) process using ultraviolet rays.

[First Heat-Treatment]

The amorphous film 14 is subjected to a first heat-treatment. In the first heat-treatment, the surface of the amorphous film 14 is irradiated with an energy beam E1 by a plurality of times in an inert gas, typically, a nitrogen atmosphere. The energy beam E1 is exemplified by a pulse laser beam emitted from a XeCl excimer laser. To uniformly irradiate the surface of the amorphous film 14 with the energy beam E1, the energy beam E1 is shaped into a plane beam.

In the first heat-treatment, the energy beam E1 is set to heat the amorphous film 14 (and a polycrystalline film 15, and further a crystalline film 16 to be described later) at such a temperature as to partially melt silicon crystal grains having {100} orientations with respect to the vertical direction of the substrate 11 and perfectly melt amorphous silicon or silicon crystal grains having face orientation other than the {100} orientations. The setting of such a temperature of the amorphous film 14 heated by the energy beam E1 is performed by adjusting parameters of the energy beam E1, specifically, an energy density, the number of irradiation, and a pulse width of the XeCl excimer laser beam.

Silicon crystal grains having the {100} orientations have melting points higher than those of silicon crystal grains having face orientations other than the {100} orientations. The interface energy between silicon crystal grains preferentially grown in the {100} orientations and the silicon oxide film 13 is about 0.01 mJ/cm² smaller than the interface energy between silicon crystal grains preferentially grown in face orientations other than the {100} orientations and the silicon oxide film 13.

Accordingly, assuming that the amorphous film 14 has a thickness of 40 nm, the melting points of silicon crystal grains having the {100} orientations are about 0.2° C. higher than those of silicon crystal grains having face orientations other than the {100} orientations (see H. A. Atwate et al.: J. Electro Chemical Society 130 (1983) 2050). The fact that silicon crystal grains having the {100} orientations have higher melting points is also revealed by a report (W. G. Hawkins et al.: Appl. Phys. Lett. 42 (1983) 358). This report shows that when silicon is melted by laser irradiation using the ZMR method and the melted silicon is observed in-situ, non-melted residues called lamellaes having the {100} orientations are present in a liquid phase.

In view of the foregoing, according to this embodiment, to allow lamellaes having the {100} orientations to remain in a liquid phase of melted silicon, the energy density of the energy beam E1 is set to about 450 mJ/cm² so as to heat the silicon at such a temperature as to partially melt silicon crystal grains having the {100} orientations and melt silicon crystal grains having face orientations other than the {100} orientations. It is to be noted that the value of the irradiation energy of the energy beams E1 contains an error of a measuring device caused at the time of measuring the energy.

The number of pulse laser irradiation is set in a range of 10 times to 400 times, typically, 150 times. If the number of pulse laser irradiation is less than 10 times, the degrees of the {100} orientations with respect to the vertical direction of the substrate 11 become very small, whereas if the number of pulse laser irradiation is more than 400 times, the total amount of evaporation of silicon becomes large.

The XeCl excimer laser is configured as a long pulse laser for emitting a pulse excimer laser beam having a pulse width of, for example, 150 ns as shown in FIG. 4. In the case of irradiating the amorphous film 14 having a thickness of 40 nm with one long pulse (pulse width: 150 ns) of the pulse laser beam, a solidifying time for solidifying the silicon melted by the pulse laser irradiation becomes 36 ns. It is to be noted that the solidifying time is also called a dwelling time for allowing a mixing state of a solid phase and a liquid phase of silicon. Accordingly, the probability of bringing the interface between the silicon oxide film 13 and the melted silicon into a thermal equilibrium state by such one pulse laser irradiation becomes large, with a result that silicon crystals having the {100} orientations occur at the interface in such a manner as to minimize the energy at the interface.

The use of the XeCl excimer laser is effective to lower the process temperature because the pulse laser irradiation takes only about 150 ns, thereby making it possible to use a plastic material for the substrate.

The pulse interval is set to 0.1 s. Such a pulse interval allows the silicon melted by the previous pulse laser irradiation to be perfectly solidified. It is to be noted that according to this embodiment, the setting of the pulse interval is not important so much.

The conditions of the first heat-treatment are listed as follows:

Irradiation Conditions
pulse width: 150 ns
pulse interval: 0.1 s
number of irradiation: 150 times
energy density: about 450 mJ/cm²

The first pulse laser irradiation is made under the above irradiation conditions. At this time, since the energy density of the energy beam E1 is set to heat the amorphous film at such a temperature as to partially melt the silicon crystal grains having the {100} orientations and melt silicon crystal grains having face orientations other than the {100} orientations, the amorphous silicon is perfectly melted, to form liquid-phase silicon 21 as shown in FIG. 3A.

Figure 5A:
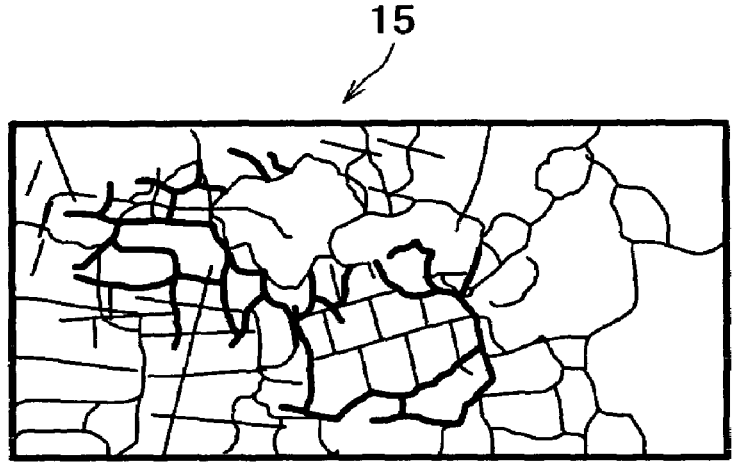
FIG. 5A is a plan view illustrating the heating step shown in FIGS. 3A to 3C.
Figure 5B:
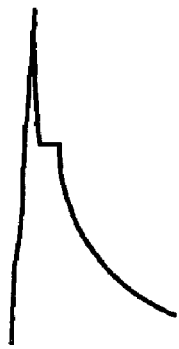
FIG. 5B is a diagram showing a schematic shape of the pulse laser beam used for the heating step shown in FIGS. 3A to 3C.

In the liquid-phase silicon 21, since the solidifying time for the melted silicon becomes 36 ns during the first pulse laser irradiation, the probability of bringing the interface between the silicon oxide film 13 and the melted silicon into a thermal equilibrium state becomes large. As a result, silicon crystals 22 having the {100} orientations occur at random at the interface in such a manner as to minimize the interface energy. After the end of the first pulse laser irradiation, the silicon crystals 22 are bonded to each other at random, to form crystal grains (solid silicon) 23 having the {100} orientations. In this way, a polycrystalline film 15 composed of polycrystalline silicon, which film partially contains the crystal grains 23 of square shapes preferentially grown in the {100} orientations, is formed as shown in FIG. 5A.

The surface of the polycrystalline film 15 is then subjected to a second pulse laser irradiation. At this time, in the polycrystalline film 15, the crystal grains 23 having the {100} orientations formed by the first pulse laser irradiation remain as lamellaes (non-melted residues), and the other region is melted as described with respect to the first pulse laser irradiation, to form liquid-phase silicon 21 as shown in FIG. 3B. In the liquid-phase silicon 21, as described with respect to the first pulse laser irradiation, crystals 22 having the {100} orientations occur at random in such a manner as to minimize the energy of the interface. After the end of the second pulse laser irradiation, as described with respect to the first pulse laser irradiation, the silicon crystals 22 are bonded to each other at random, to newly form crystal grains 23 having the {100} orientations.

The pulse laser irradiation is further repeated in the same manner as that of the first and second pulse laser irradiations. At this time, the crystal grains 23 having the {100} orientations formed by the previous pulse laser irradiation remain as lamellaes (non-melted residues), and in the other region of the liquid-phase silicon 21, crystals 22 having the {100} orientations newly occur at the interface between the silicon oxide film 13 and the liquid crystal silicon 21 as shown in FIG. 3C. After the end of the pulse laser irradiation, the silicon crystals 22 are bonded to each other at random, to newly form crystal grains 23 having the {100} orientations. As a result of repetition of the pulse laser irradiation as shown in FIG. 6B, the number of the crystal grains 23 preferentially grown in the {100} orientations with respect to the vertical direction of the substrate 11 becomes large as shown in FIG. 6A.

The pulse laser irradiation is further repeated as shown in FIG. 7B, and after the amorphous film 14 is subjected to the 150th pulse laser irradiation, a crystalline film 16 having square-shaped crystal grains preferentially grown in the {100} orientations with respect to the vertical direction of the substrate 11 is formed. The grain boundaries of the square-shaped crystal grains of the polycrystalline film 16 are very sharp as shown in FIG. 7A. The degrees of orientations, offset from the {100} orientations by an angle within 10°, is in a range of 80% or more. On the other hand, in the crystalline film 16, the crystal grains have various face orientations in the in-plane direction of the substrate 11. It is to be noted that lateral crystal growth occurs with the crystals 22 having the {100} orientations taken as nuclei; however, such lateral crystal growth is negligible as compared with the above-described crystal growth due to occurrence of the crystals 22 having the {100} orientations in the liquid-phase silicon 21.

In this way, according to the first heat-treatment, the amorphous film 14 is uniformly subjected to pulse laser irradiation by 150 times in such a manner as to be heated at such a temperature as to partially melt silicon crystal grains having the {100} orientations with respect to the vertical direction of the substrate 11 and melt amorphous silicon or crystal grains having face orientations other than the {100} orientations, to selectively repeat the crystal grain formation step in which the crystals 22 having the {100} orientations newly occur at the interface between the silicon oxide film 13 and the liquid-phase silicon 21 and the silicon crystals 22 are bonded to each other at random, to newly form silicon crystal grains 23 having the {100} orientations. As a result, the crystalline film 16 having the square-shaped crystal grains preferentially grown in the {100} orientations with respect to the vertical direction of the substrate 11 is formed, wherein the crystal grain boundaries of the crystal grains in the polycrystalline film 16 become sharp. This makes it possible to enhance the crystallinity of the crystalline film 16.

Since the first heat-treatment is performed by irradiating the amorphous film with a pulse laser beam emitted from the excimer laser, the crystalline film 16 having good crystallinity can be obtained at a low temperature even by using the substrate 11 made from a plastic material or a glass material.

[Second Heat-Treatment]

The crystalline film 16 obtained by the first heat-treatment is subjected to a second heat-treatment. In the second heat-treatment, as shown in FIG. 8, a diffraction grating 31 functioning as a mask is provided in such a manner as to be separated from the crystalline film 16 by a gap L, and an energy beam E2 emitted from a XeCl excimer laser is projected from above the diffraction grating 31 in a nitrogen atmosphere by a plurality of times. The energy beam E2 is modulated by the diffraction grating 31, to selectively form, on the crystalline film 16, a temperature distribution having maximum temperature regions 16H and minimum temperature regions 16L whose temperatures are lower than those of the maximum temperature regions 16H as shown in FIG. 9. The temperature of the minimum temperature region 16L is set to, for example, such a temperature as to partially melt crystal grains having the {100} orientations.

The diffraction grating 31 is made from quartz, and has a plurality of very fine grooves. A gap "a" between the adjacent grooves of the diffraction grating 31 is set to 2 μm. The presence of such very fine grooves causes interference between light components diffracted from the adjacent grooves. Assuming that the energy beam E2 is made incident on the diffraction grating 31 at a variable incident angle θ, a pitch "d" of interference patterns formed on the crystalline film 16 by the diffraction grating 31 is expressed by an equation of d=a/2, which is irrespective of the incident angle θ. That is to say, even if the energy beam E2 is made incident on the diffraction grating 31 at the variable incident angle θ, the pitch of the interference patterns is not affected by the incident angle θ.

The energy density of the energy beam E2 is set to 450 mJ/cm$^2$ so as to heat the minimum temperature region 16L at such a temperature as to partially melt crystal grains having the {100} orientations. With this setting of the energy density, in the minimum temperature regions 16L, crystal grains having the {100} orientations partially remain as lamellaes 24 (non-melted residues, that is, solid silicon). On the other hand, in the regions other than the minimum temperature regions 16L, crystal grains having the {100} orientations are perfectly melted, to become liquid-phase silicon. At this time, at the solid-liquid interfaces, each lamellae 24 has the {111} faces as side faces (see FIG. 10); however, since the {111} faces of the lamellae 24 are directed in the maximum temperature gradient directions, and therefore, preferentially oriented toward the solid-liquid interfaces, that is, the maximum temperature regions 16H. As a result, by suitably modulating the temperature distribution of the crystalline film 16, the orientations of crystal grains in the polycrystalline film 16 within the in-plane direction of the substrate 11 can be controlled.

In the case of modulating a pulse laser beam in two orthogonal directions, a temperature distribution controlled in orthogonal two directions of the crystalline film 16 is formed by using the diffraction grating 31 having grooves arranged in a matrix, and pulse laser irradiation is performed under the following conditions. With respect to the diffraction grating 31, the pitch "a" is set to 2 μm, and the gap L is set to 150 μm.

Irradiation Conditions
pulse width: 150 ns
pulse interval: 0.1 s
number of irradiation: 150 times
energy density: about 450 mJ/cm$^2$ First, as shown in FIG. 11A, the crystalline film 16 obtained by the first heat-treatment is prepared. The crystalline film 16 has the crystal grains preferentially grown in the {100} orientations with respect to the vertical direction of the substrate 11 and are grown in various face orientations in the in-plane direction of the substrate 11. A temperature distribution is formed on the crystalline film 16 by using the diffraction grating 31 capable of modulating the pulse laser beam in the orthogonal two directions. To be more specific, as shown in FIG. 11B, four maximum temperature regions 16H$_2$ are formed at four points around each crystal grain (two points on both ends of the extension line of a diagonal of the crystal grain), and a minimum temperature region 16L$_2$ is formed in a region surrounded by these four maximum temperature regions 16H$_2$.

Figure 11D:
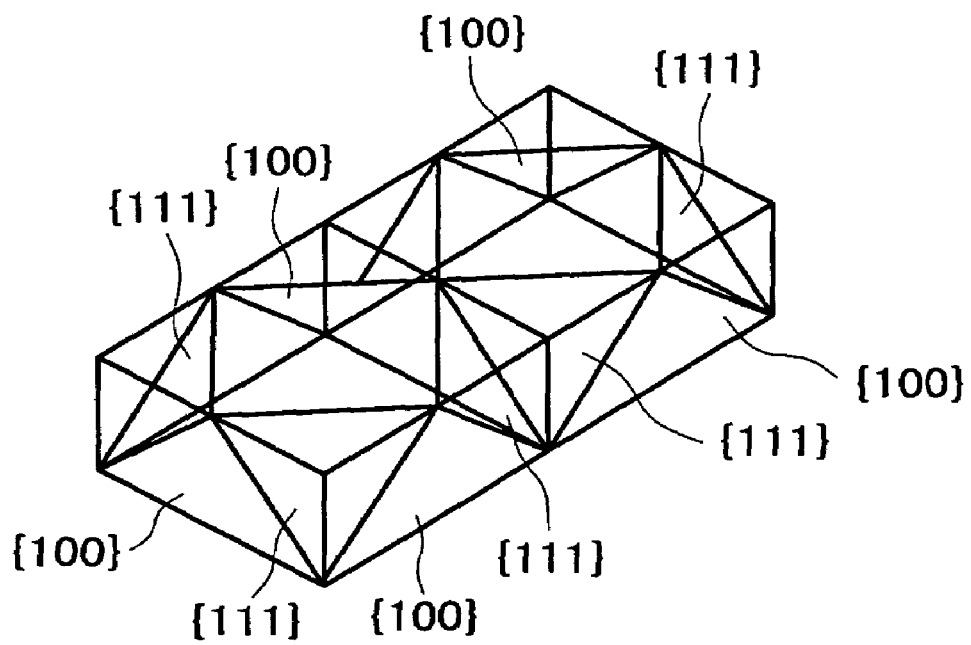
Figure 11E:
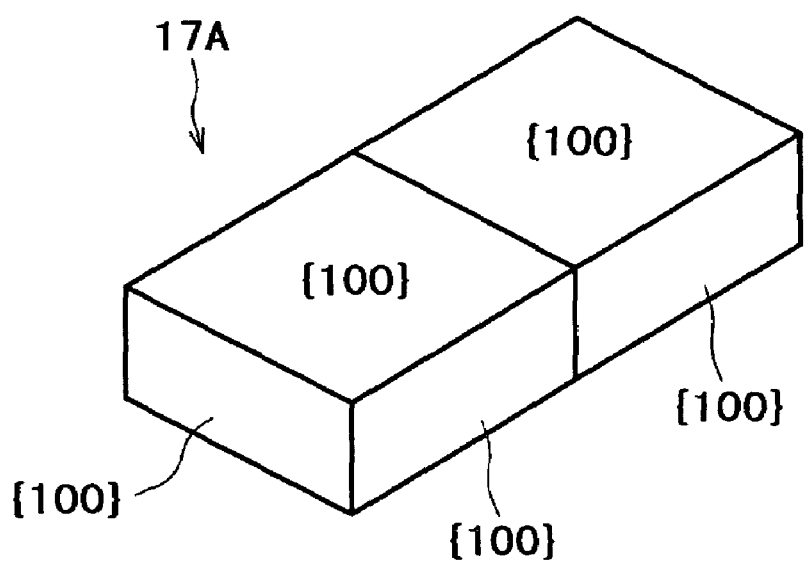

At this time, since the temperature of the minimum temperature region 16L$_2$ is set to the above-described value, by subjecting the crystalline film 16 to one pulse laser irradiation, lamellaes 24 having the {100} orientations with respect to the vertical direction of the substrate 11 remain. The lamellae 24 is rolled with the {111} faces (side faces)

directed toward the maximum temperature regions $16H_2$ in a state that the {100} orientations are kept in the vertical direction of the substrate 11 as shown in FIG. 1C. After one pulse laser irradiation, crystal grains are formed by lateral crystal growth with the lamellaes 24 as nuclei. The crystal grains are preferentially grown in the {100} orientations with respect to the vertical direction of the substrate 11, and are preferentially grown in the {100} orientations in the in-plane direction of the substrate 11 as shown in FIGS. 11D and 11E.

As a result of further repetition of pulse laser irradiation, the number of crystal grains preferentially grown in the {100} orientations in the in-plane direction of the substrate 11 becomes large, and after the 150th pulse laser irradiation, a crystalline film 17A having crystal grains preferentially grown in the {100} orientations with respect to the vertical direction of the substrate 11 and preferentially grown in the {100} orientations in the in-plane direction of the substrate 11 is formed. Since the crystal grains are preferentially grown in the {100} orientations in the in-plane direction of the substrate 11, the crystal grain boundaries in the crystalline film 17A are controlled. It is to be noted that the crystal growth due to occurrence of nuclei having the {100} orientations in the liquid-phase silicon is performed; however, such crystal growth is negligible as compared with the lateral crystal growth with the crystal grains having the {100} orientations taken as nuclei.

In the case of modulating a pulse laser beam in one direction, the diffraction grating 31 having grooves arrayed in the one direction is used to form, on the crystalline film 16, a temperature distribution controlled in the one direction on the crystalline film 16, and the polycrystalline film 16 is irradiated with the modulated pulse laser beam under the following irradiation conditions. With respect to the diffraction grating 31, the pitch "a" is set to 2 μm and the gap L is set to 150 μm.

Irradiation Conditions
pulse width: 150 ns
pulse interval: 0.1 s
number of irradiation: 150 times
energy density: about 450 mJ/cm$^2$ First, as shown in FIG. 12A, the crystalline film 16 is prepared. A temperature distribution controlled in one direction is formed by using the diffraction grating 31 capable of modulating a pulse laser beam in the one direction. The temperature distribution has maximum temperature regions $16H_1$ and minimum temperature regions $16L_1$ along the one direction in such a manner that each of the minimum temperature regions $16L_1$ is formed between two of the maximum temperature regions $16H_1$ as show in FIG. 12B. The temperature of the minimum temperature region $16L_1$ is set to such a temperature as to partially melt crystal grains having the {100} orientations.

Figure 12D:
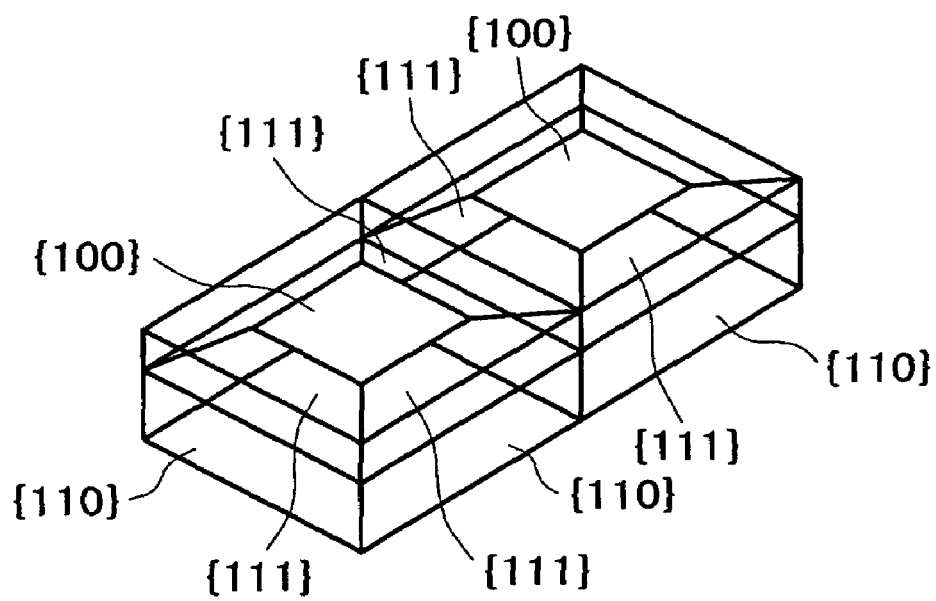
Figure 12E:
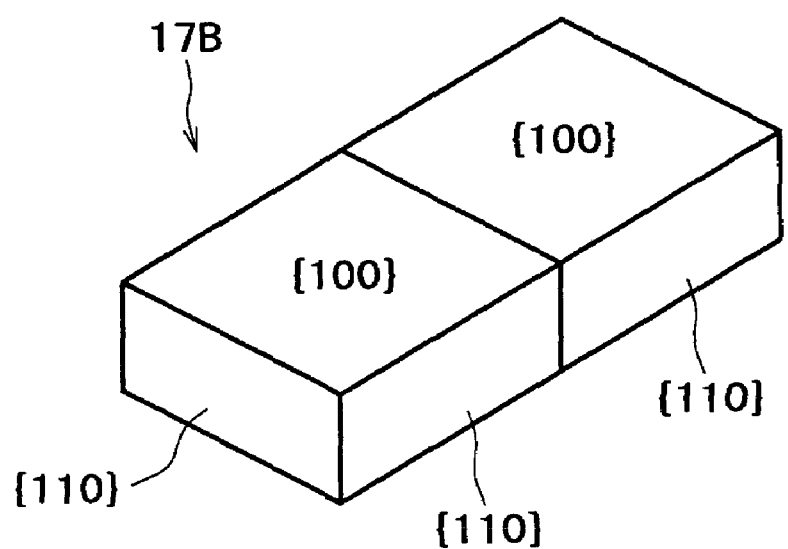

Since the temperature of the minimum temperature region $16L_1$ is set as described above, the lamellaes 24 having the {100} orientations with respect to the vertical direction of the substrate 11 remain non-melted by one pulse laser irradiation. The lamellae 24 is rolled with the {111} faces (side faces) of the lamellae 24 directed toward the maximum temperature regions $16H_1$ in a state that the {100} orientations of the lamellae 24 are kept in the vertical direction of the substrate 11 as shown in FIG. 12C. After the end of the one pulse laser irradiation, crystal grains are newly formed by lateral crystal growth with the lamellaes 24 taken as nuclei. The crystal grains are preferentially grown in the {100} orientations with respect to the vertical direction of the substrate 11 and are preferentially grown in the {110} orientations in the in-plane direction of the substrate 11 as shown in FIGS. 12D and 12E.

As a result of further repetition of pulse laser irradiation, the number of crystal grains preferentially grown in the {110} orientations in the in-plane direction of the substrate 11 become large, and after the 150th pulse laser irradiation, a crystalline film 17B having crystal grains preferentially grown in the {100} orientations with respect to the vertical direction of the substrate 11 and preferentially grown in the {110} orientations in the in-plane direction of the substrate 11 is formed. In this polycrystalline film 17B, since the crystal grains have been preferentially grown in the {110} orientations in the in-plane direction of the substrate 11, the grain boundaries of the crystal grains in the polycrystalline film 17B are controlled. It is to be noted that crystal growth due to occurrence of nuclei having the {100} orientations in the liquid-phase silicon occurs; however, such crystal growth is negligible as compared with the lateral crystal growth with the crystal grains having the {100} orientations taken as nuclei.

In this way, according to the second heat-treatment, the crystalline film 16 is irradiated with the energy beam E2 from above the diffraction grating 31 as a mask by 150 times. In this pulse laser irradiation, the temperature distribution having the maximum temperature regions 16H and the minimum temperature regions 16L is selectively formed on the crystalline film 16, wherein the temperature of the minimum temperature region 16L is set to such a temperature as to partially melt the crystal grains having the {100} orientations. As a result, the lamellae 24 occurring upon the pulse laser irradiation is rolled with the {110} faces (side faces) directed to the maximum temperature regions 16H in a state that the {100} orientations of the lamellae 24 are kept in the vertical direction of the substrate 11. The lateral crystal growth occurs with the lamellaes 24 as crystal nuclei, with a result that the crystalline film 17A or 17B having crystal grains preferentially grown in the {100} orientations in the vertical direction of the substrate 11 and preferentially grown in the controlled orientations in the in-plane direction of the substrate 11 is formed. Accordingly, the crystal grains in the crystalline film 17A or 17B are not only preferentially grown in the {100} orientations in the vertical direction of the substrate 11 but also preferentially grown in the controlled orientations in the in-plane direction of the substrate 11, to control the boundaries of the crystal grains, thereby enhancing the crystallinity of the crystalline film 17A or 17B.

Since the second heat-treatment is performed by pulse laser irradiation using the excimer laser, the crystalline film 17A or 17B having good crystallinity can be formed at a low temperature even by using a substrate made from a plastic material or a glass material.

After formation of the crystalline film 17A or 17B, a liquid crystal display unit including TFTs is fabricated by using the substrate 11 provided with such a crystalline film 17A or 17B in accordance with a general known method. The process typically includes steps of forming a gate oxide film after device isolation, forming a source region and a drain region after formation of a gate electrode, forming an interlayer insulating film, forming a contact hole, forming metal wiring and ITO (Indium-Tin Oxide), and enclosing liquid crystal. The steps of the method of producing a crystalline film and the method of fabricating a semiconductor device according to the preferred embodiments are thus ended, to accomplish the semiconductor device unit shown in FIG. 1.

The above-described embodiments of the present invention have the following advantages.

The first heat-treatment is performed as follows: namely, the amorphous film 14 or the polycrystalline film 15 is uniformly heat-treated by a plurality of times at such a temperature as to partially melt silicon crystal grains having the {100} orientations with respect to the vertical direction of the substrate 11 and melt amorphous silicon or silicon crystal grains having face orientations other than the {100} orientations. As a result, it is possible to form the crystalline film 16 which has crystal grains preferentially grown in the {100} orientations with respect to the vertical direction of the substrate 11, to form the square-shaped sharp crystal grain boundaries, thereby enhancing the crystallinity. For example, the degrees of orientations, offset from the {100} orientations by an angle within a range of 10°, can be set in a range of 80% or more. In particular, since the heat-treatment is performed by pulse laser irradiation using the XeCl excimer laser, it is possible to form the crystalline film 16 having good crystallinity at a low temperature even by using a substrate made from a glass material or plastic material, and hence to reduce the production cost.

The second heat-treatment is performed as follows: namely, the crystalline film 16 formed by the first heat-treatment is heat-treated by a plurality of times in such a manner that a temperature distribution having the maximum temperature regions 16H and the minimum temperature regions 16L whose temperatures are lower than those of the maximum temperature regions 16H is selectively formed on the crystalline film 16 by using the diffraction grating 31, wherein the temperature of the minimum temperature region 16L is set so as to partially melt crystal grains having the {100} orientations. As a result, the crystal grain boundaries in the in-plane direction of the substrate 11 are controlled in a state that the preferential {100} orientations are kept with respect to the vertical direction of the substrate 11.

For example, in the case of using the diffraction grating capable of modulating the temperature distribution in orthogonal two directions, it is possible to form the crystalline film 17A having crystal grains preferentially grown in the {100} orientations with respect to the vertical direction of the substrate 11 and preferentially grown in the {100} orientations in the in-plane direction of the substrate 11. Meanwhile, in the case of using the diffraction grating capable of modulating the temperature distribution in one direction, it is possible to form the crystalline film 17B having crystal grains preferentially grown in the {100} orientations with respect to the vertical direction of the substrate 11 and preferentially grown in the {110} orientations in the in-plane direction of the substrate 11.

By using the crystalline film 17A or 17B having good crystallinity for forming a semiconductor device such as a TFT, it is possible to equalize the quality of the semiconductor device and improve the performance thereof.

While the preferred embodiments of the present invention have been described, the present invention is not limited thereto but may be variously modified.

For example, in the above-described first heat-treatment, the number of pulse laser irradiation is set to 150 times, the energy density is set to 450 mJ/cm$^2$, and the pulse width is set to 150 ns; however, each of the number of pulse laser irradiation, the energy density, and the pulse width may be changed insofar as the amorphous film 14 (polycrystalline film 15, crystalline film 16) is heated at such a temperature as to partially melt silicon crystal grains, for example, having the {100} orientations with respect to the vertical direction of the substrate 11 and melt the amorphous silicon or silicon crystal grains having face orientations other than the {100} orientations.

In the above-described second heat-treatment, the number of pulse laser irradiation is set to 150 times, the energy density is set to 450 mJ/cm$^2$, and the pulse width is set to 150 ns; however, each of the number of pulse laser irradiation, the energy density, and the pulse width may be changed insofar as the temperature of each low temperature region of the temperature distribution for forming the crystalline film 17A or 17B is set to partially melt the crystal grains having the {100} orientations.

In each of the first and second heat-treatments, the film is heated by using the energy beam E1 emitted from the XeCl excimer laser; however, the film may be heated by a general electric furnace (diffusion furnace) or another heating means such as a lamp. Further, the XeCl excimer laser may be replaced by any other laser.

In the embodiments, description has been made by example of the method of forming the crystalline film 16, 17A, or 17B composed of a quasi-single crystal phase in which a group of square-shaped nearly-single crystal grains preferentially grown in the {100} orientations with respect to the vertical direction of the substrate 11 are arrayed in a grid shape by the first heat-treatment or the second heat-treatment; however, crystal grains in the crystalline film 16, 17A, or 17B may be preferentially grown in face orientations other than the {100} orientations.

In the embodiments, description has been made by example of the method of producing a crystalline semiconductor material represented by the crystalline film 16, 17A or 17B made from silicon; however, the present invention can be applied to a method of producing another crystalline semiconductor material such as a covalent type semiconductor having a diamond type crystal structure, typically, another group IV semiconductor. In addition, examples of the group IV semiconductors include silicon, germanium (Ge), carbon (C), and a compound semiconductor containing at least one kind selected from a group consisting of silicon, germanium, and carbon, for example, SiGe or SiC.

In the embodiments, after the crystalline film 17A or 17B is formed, a TFT is formed by using the crystalline film 17A or 17B and a liquid crystal display unit is fabricated by using the TFTs in accordance with a known method; however, after the crystalline film 16 is formed, a TFT may be formed by using the crystalline film 16 and a liquid crystal display unit be fabricated by using the TFTs in accordance with a known method. With this configuration, since the crystalline film 16 is used for forming a semiconductor device such as a TFT, it is possible to equalize the quality of the semiconductor device and enhance the performance thereof.

In the above embodiments, description has been made by example of the liquid crystal display unit 100 as a semiconductor device unit including semiconductor devices of the present invention; however, the present invention is applicable to another semiconductor device unit including semiconductor devices, for example, a solar cell.

The present invention will become more apparent by way of the following examples.

EXAMPLE

Figure 14:
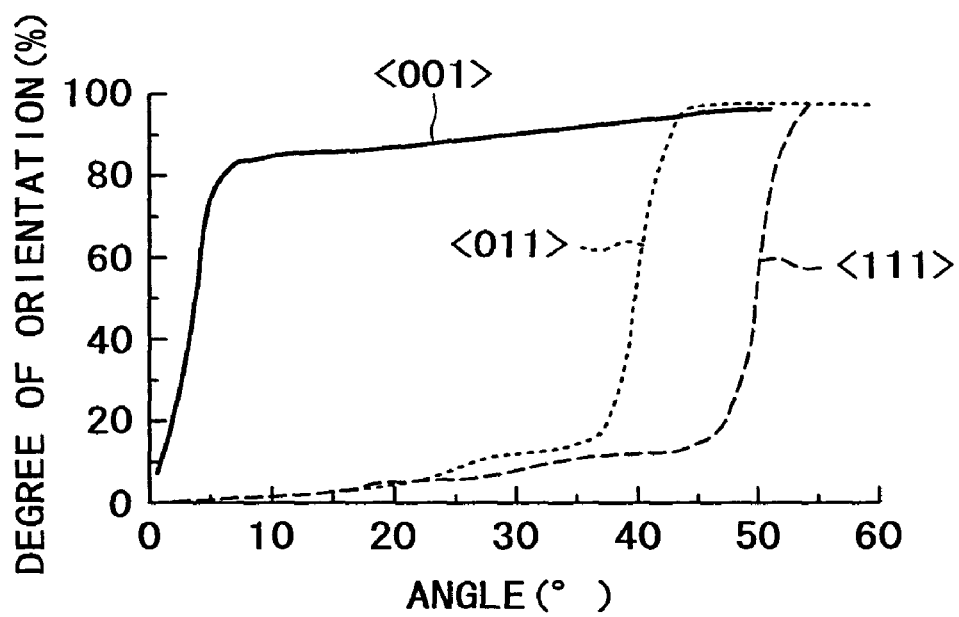
FIG. 14 is a diagram showing the degrees of crystal orientations of the sample having been subjected to the first heat-treatment.
Figure 15:
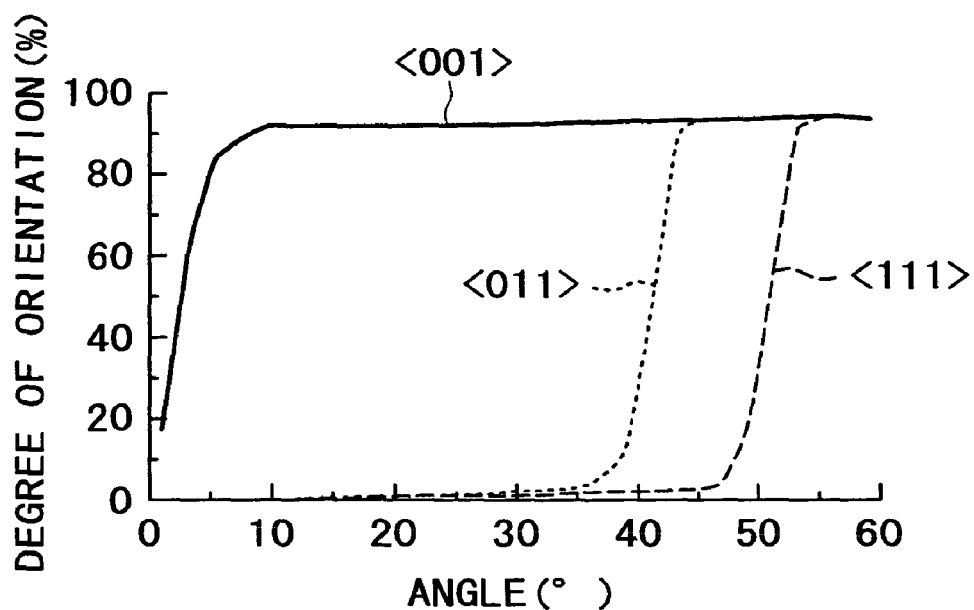
FIG. 15 is a diagram showing the degrees of crystal orientations of the sample having been subjected to the first heat-treatment.
Figure 16:
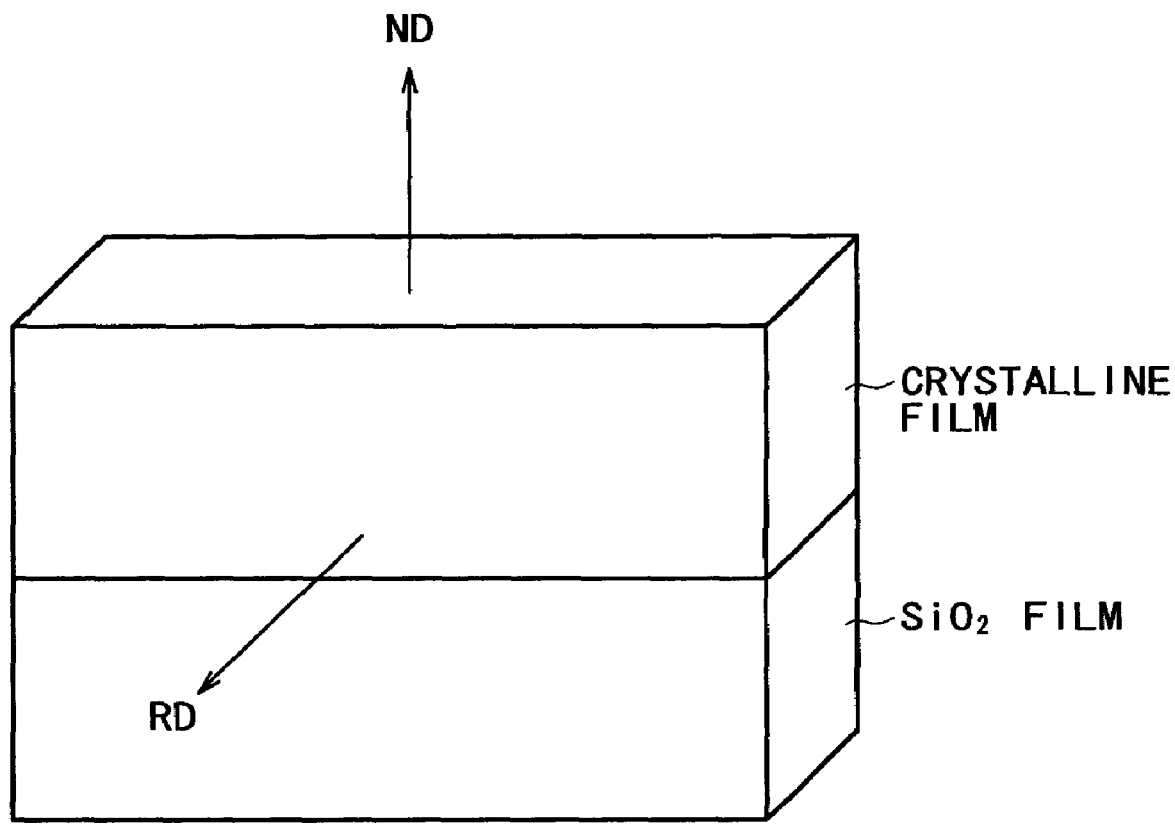
FIG. 16 is a view illustrating the crystal orientations of the sample having been subjected to the first heat-treatment.

FIG. 13A is a SEM (Scanning Electron Microscope) photograph of a crystalline film obtained by the first heat-treatment under the following conditions. FIGS. 13B and 13C are EBSP (Electron Back Scattering Pattern) photographs of the crystalline film in a normal direction and a rolling direction, respectively. FIG. 14 is a graph indicating the degrees of the {100} orientations with respect to the vertical direction of a glass substrate after repetition of pulse laser irradiation by 150 times, and FIG. 15 is a graph indicating the degrees of the {100} orientations with respect to the vertical direction of the glass substrate after repetition of pulse laser irradiation by 200 times. FIG. 16 is a view illustrating the normal direction (vertical direction of the glass substrate) and the rolling direction (in-plane direction of the glass substrate) shown in FIGS. 13B and 13C.

In addition, before the SEM photograph of the crystalline film is taken, the crystalline film is subjected to Secco etching. The Secco etching is performed to increase the sharpness of crystal grain boundaries in the crystalline film by making use of the characteristic that the etching rate for a region containing defects is different from that for another region. In the embodiments, a water-solution containing potassium dichromate ($K_2Cr_2O_7$), hydrogen fluoride (HF) and water ($H_2O$) at a mixing rate of 1:2:9 is used as an etching solution for Secco etching.

Sample Structure amorphous silicon film (thickness: 40 nm)/$SiO_2$ film (thickness: 120 nm)/$SiN_x$ film (thickness: 50 nm)/glass substrate Irradiation Conditions pulse width: 150 ns pulse interval: 0.1 s number of irradiation: 150 times energy density: about 450 mJ/cm$^2$ From the data obtained in the example, it is apparent that as a result of the first heat-treatment, the amorphous silicon film is crystallized, to form a crystalline film having crystal grains preferentially grown in the {100} orientations with respect to the vertical direction of the glass substrate. It is also apparent that the degrees of orientations, offset from the {100} orientations by an angle within a range of 10°, becomes 83%, and that the degrees of orientations, offset from the {100} orientations by an angle within a range of 10°, is increased to 96.4% by increasing the number of pulse laser irradiation to 200 times. It is further apparent that the crystal grains are directed in various orientations in the in-plane direction of the glass substrate.

FIGS. 17A and 17B each show part of the result of X-ray analysis of the sample irradiated with a specific number (50 times, 100 times, and 150 times) of pulses of a laser beam. FIG. 17A shows the (111) peak, and FIG. 17B shows the (110) peak. FIG. 17C shows the whole of the result of X-ray analysis of the sample irradiated with laser beams by 150 times. The data of FIGS. 17A to 17C show that the peak of silicon crystal grains having the {100} orientations becomes large and the peak of silicon crystal grains having the {111} orientations becomes smaller as the number of pulse laser irradiation becomes large.

FIG. 18 is a EBSP photograph of a crystalline film obtained by the second heat-treatment performed, after the first heat-treatment, under the following conditions by using a diffraction grating capable of modulating a pulse laser beam in one direction. The photograph is taken along the in-plane direction of the glass substrate. The EBSP photograph shows that crystal grains in the crystalline film are preferentially grown in the {100} orientations with respect to the vertical direction of the glass substrate and preferentially grown in the {110} orientations in the in-plane direction of the glass substrate.

Irradiation Conditions pulse width: 150 ns pulse interval: 0.1 s number of irradiation: 150 times energy density: about 450 mJ/cm$^2$ In this way, it is apparent that the second heat-treatment performed, after the first heat-treatment, by using the diffraction grating capable of modulating a pulse laser beam in one direction, the crystal grains in the crystalline film are preferentially grown in the {100} orientations with respect to the vertical direction of the glass substrate and preferentially grown in the {110} orientations in the in-plane direction of the glass substrate.

FIG. 19 is a SEM photograph of the crystalline film thus obtained. The photograph shows that the crystal grain boundaries in the crystalline film are also controlled by the first and second heat-treatments. In addition, before the SEM photograph of the crystalline film is taken, the crystalline film is subjected to Secco etching.

The present invention configured as described above has the following effects:

According to the first method of producing a crystalline semiconductor material or according to the first method of fabricating a semiconductor, a crystalline film is formed by uniformly heat-treating an amorphous material or a polycrystalline material by a plurality of times at such a temperature as to partially melt crystal grains having a specific face orientation with respect to the vertical direction of the surface of the substrate and melt the amorphous material or crystal grains having a face orientation other than the specific face orientation. The crystalline film thus formed has the crystal grains preferentially grown in the specific face orientation with respect to the vertical direction of the substrate. As a result, it is possible to form a crystalline film having good crystallinity and hence to fabricate a semiconductor device such as a TFT excellent in equalization and performance by using such a crystalline film.

In the above-described method, since the heat-treatment is performed by pulse laser irradiation using an excimer laser, it is possible to form a crystalline film having good crystallinity at a low temperature even on a substrate made from a glass material or plastic material, and hence to reduce the production cost.

According to the second method of producing a crystalline semiconductor material or the second method of fabricating a semiconductor device, in the second step, a first crystalline film is formed by uniformly heat-treating the amorphous material or the polycrystalline material by a plurality of times at such a temperature as to partially melt crystal grains having a specific face orientation with respect to the vertical direction of the surface of the substrate and to melt the amorphous material or crystal grains having a face orientation other than the specific face orientation; and in the third step, a second crystalline film is formed by heat-treating the first crystalline film by a plurality of times so as to selectively form, on the first crystalline film, a temperature distribution having a high temperature region and a low temperature region whose temperature is lower than that of the high temperature region, wherein the temperature of the low temperature region is set to partially melt the crystal grains having the specific face orientation. Accordingly, in the second crystalline film, the crystal grains can be preferentially grown in the specific face orientation with respect to the vertical direction of the substrate and also preferentially grown in a controlled face orientation in the in-plane direction of the substrate. This makes it possible to control the crystal grain boundaries. As a result, it is possible to form a crystalline film having good crystallinity and hence to fabricate a semiconductor device such as a TFT excellent in equalization and performance by using such a crystalline film.

In the above-described method, since each of the first and second heat-treatments is performed by pulse laser irradiation using an excimer laser, it is possible to form a crystalline film having good crystallinity at a low temperature even on a substrate made from a glass material or plastic material, and hence to reduce the production cost.

While the preferred embodiments of the present invention have been described using the specific terms, such description is for illustrative purposes only, and it is to be understood that changes and variations may be made without departing from the spirit or scope of the following claims.

What is claimed is:

1. A method of producing a crystalline semiconductor material, comprising:
    (a) a first step of forming a starting material on a substrate, wherein said starting material is selected from the group consisting of amorphous semiconductor material and polycrystalline semiconductor material;
    (b) a second step of forming a first crystalline material comprising crystal grains preferentially grown in the {100} orientation with respect to the vertical direction of the substrate by uniformly heat-treating said starting material by a plurality of times;
    (c) a third step of forming a second crystalline material by heat-treating said first crystalline material by a plurality of times so as to form, on said first crystalline material, a high temperature region and a low temperature region, wherein:
        (i) the temperature of said low temperature region is lower than the temperature of said high temperature region; and
        (ii) the temperature of said low temperature region is such as to partially melt said crystal grains having said specific face orientation with respect to the vertical direction of the surface of said substrate.

2. A method of producing a crystalline semiconductor material according to claim 1, wherein said starting material comprises at least one material selected from the group consisting of silicon (Si), germanium (Ge), and carbon (C).

3. A method of producing a crystalline semiconductor material according to claim 2, further comprising the step of forming a silicon oxide film between said substrate and said starting material.

4. A method of producing a crystalline semiconductor material according to claim 3, wherein said face orientation is a {100} orientation.

5. A method of producing a crystalline semiconductor material according to claim 1, wherein said heat-treatment in said second step is performed by irradiating said starting material with a pulse laser beam.

6. A method of producing a crystalline semiconductor material according to claim 5, wherein said pulse laser beam is an excimer laser beam.

7. A method of producing a crystalline semiconductor material according to claim 6, wherein a pulse width of said pulse laser beam is set to 150 ns.

8. A method of producing a crystalline semiconductor material according to claim 7, wherein the number of pulse laser irradiation is in a range of 10 times to 400 times.

9. A method of producing a crystalline semiconductor material according to claim 1, wherein said substrate comprises a material selected from the group consisting of glass and plastic.

10. A method of fabricating a semiconductor device comprising:
    (a) a first step of forming a starting material on a substrate, wherein said starting material is selected from the group consisting of amorphous semiconductor materials and polycrystalline semiconductor materials;
    (b) a second step of forming a first crystalline material comprising crystal grains preferentially grown in the {100} orientation with respect to the vertical direction of the substrate by uniformly heat-treating said starting material by a plurality of times;
    (c) a third step of forming a second crystalline material by heat-treating said first crystalline material by a plurality of times so as to selectively form, on said first crystalline material, a temperature distribution having a high temperature region and a low temperature region, wherein:
        (i) the temperature of said low temperature region is lower than the temperature of said high temperature region; and
        (ii) the temperature of said low temperature region is such as to partially melt said crystal grains having said specific face orientation with respect to the vertical direction of the surface of said substrate.

11. A method of producing a semiconductor device according to claim 10, wherein said starting material comprises a material selected from a group consisting of silicon (Si), germanium (Ge), and carbon (C).

12. A method of fabricating a semiconductor device according to claim 11, further comprising the step of forming a silicon oxide film between said substrate and said starting material.

13. A method of fabricating a semiconductor device according to claim 12, wherein said face orientation is a {100} orientation.

14. A method of fabricating semiconductor device according to claim 10, wherein said heat-treatment in said second step is performed by irradiating said starting material with a pulse excimer laser beam.

15. A method of producing a crystalline semiconductor material according to claim 1, wherein said temperature distribution is formed by modulating a pulse laser beam in one direction in said third step.

16. A method of producing a crystalline semiconductor material according to claim 1, wherein said temperature distribution is formed by modulating a pulse laser beam in orthogonal two directions in said third step.

17. A method of producing a crystalline semiconductor material according to claim 1, wherein said temperature distribution is formed by using a diffraction grating in said third step.

18. A method of fabricating a semiconductor device to claim 10, wherein said temperature distribution is formed by modulating a pulse laser beam in one direction in said third step.

19. A method of fabricating a semiconductor device according to claim 10, wherein said temperature distribution is formed by modulating a pulse laser beam in orthogonal two directions in said third step.

20. A method of fabricating a semiconductor device according to claim 10, wherein said temperature distribution is formed by using a diffraction grating in said third step.

* * * * *